(12) United States Patent
Chou et al.

(10) Patent No.: US 7,288,814 B2
(45) Date of Patent: Oct. 30, 2007

(54) SELECTIVE POST-DOPING OF GATE STRUCTURES BY MEANS OF SELECTIVE OXIDE GROWTH

(75) Inventors: Anthony I. Chou, Beacon, NY (US); Toshiharu Furukawa, Essex Junction, VT (US); Steven J. Holmes, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 11/268,100

(22) Filed: Nov. 7, 2005

(65) Prior Publication Data
US 2006/0057811 A1   Mar. 16, 2006

Related U.S. Application Data

(62) Division of application No. 10/732,657, filed on Dec. 10, 2003, now Pat. No. 6,995,065.

(51) Int. Cl.
*H01L 29/94* (2006.01)
(52) U.S. Cl. .............. 257/327; 257/344; 257/346; 257/408; 257/E29.266
(58) Field of Classification Search ........ 257/327, 257/344, 346, 408, E29.266
See application file for complete search history.

(56) References Cited

U.S. PATENT DOCUMENTS

| 5,885,874 | A | 3/1999 | Gardner |
| 5,907,777 | A | 5/1999 | Joseph et al. |
| 5,908,312 | A | 6/1999 | Cheung et al. |
| 5,976,925 | A | 11/1999 | Cheek et al. |
| 6,080,629 | A | 6/2000 | Gardner et al. |
| 6,316,319 | B1 | 11/2001 | Ishida et al. |
| 6,329,225 | B1 * | 12/2001 | Rodder ............... 438/151 |
| 6,335,248 | B1 | 1/2002 | Mandelman et al. |
| 6,383,920 | B1 | 5/2002 | Wang et al. |
| 6,406,973 | B1 | 6/2002 | Lee |
| 6,432,763 | B1 | 8/2002 | Yu |
| 6,548,877 | B2 * | 4/2003 | Yang et al. ........... 257/382 |
| 2002/0084493 | A1 | 7/2002 | Marshall et al. |
| 2004/0266121 | A1 * | 12/2004 | Wu et al. ............. 438/303 |

* cited by examiner

*Primary Examiner*—Mary Wilczewski
*Assistant Examiner*—Toniae M Thomas
(74) *Attorney, Agent, or Firm*—Scully, Scott, Murphy & Presser, P.C.; Yuanman Cai

(57) ABSTRACT

A method for doping a polysilicon gate conductor, without implanting the substrate in a manner that would effect source/drain formation is provided. The inventive method comprises forming at least one polysilicon gate region atop a substrate; forming oxide seed spacers abutting the polysilicon gate; forming source/drain oxide spacers selectively deposited on the oxide seed spacers by liquid phase deposition, and implanting at least one polysilicon gate region, wherein the source/drain oxide spacers protect an underlying portion of the substrate. Multiple gate regions may be processed on a single substrate using conventional patterning. A block-mask provided by patterned photoresist can be used prior to implantation to pre-select the substrate area for gate conductor doping with one dopant type.

16 Claims, 17 Drawing Sheets

SELECTIVE POST-DOPING OF GATE STRUCTURES BY MEANS OF SELECTIVE OXIDE GROWTH

RELATED APPLICATIONS

This application is a divisional of U.S. application Ser. No. 10/732,657, filed Dec. 10, 2003 now U.S. Pat. No. 6,995,065.

FIELD OF INVENTION

The present invention relates to semiconductor devices and a method of manufacture, and more particularly to the post doping of gate structures using a selective oxide growth process.

BACKGROUND OF THE INVENTION

State of the art metal oxide semiconductor field effect transistors (MOSFET) are fabricated by depositing a gate region atop a semiconducting substrate, where the gate region includes a gate conductor over a gate dielectric. The gate region may be formed by first forming a gate dielectric followed by formation of a gate conductor. The gate conductor may be doped polysilicon. With polysilicon gate MOSFETS, it is important to reduce the gate carrier-depletion effect by doping the polysilicon heavily enough, particularly near the gate dielectric interface to improve MOSFET device performance. However, with the conventional manufacturing process, it is difficult to dope the polysilicon gate in such a way to minimize the gate depletion effect without compromising the optimum source and drain diffusion doping profile, because the polysilicon and source/drain diffusion are doped by the same ion implantations. It is desirable to supply additional dopant only to the polysilicon gate, but not the source/drain diffusion. One method to do this is known as selective "pre-doping" of the gate. Conventionally, selective gate doping has been accomplished by masking the layer of gate conductor using conventional photolithography followed by doping the exposed regions by ion implantation. Following doping, the gate conductor and gate dielectric are then etched to form the gate region.

A disadvantage of the above approach is that it is difficult to etch a gate polysilicon film having doped and undoped regions or regions doped by two different dopants, since the difference in dopant concentration and dopant species creates an etch bias, where the regions doped differently etch at a different rate. The etch differential, between the regions of the gate conductor results in variation of the width of the gate features. Uniformity of the width of the gate conductor is of particular importance to the manufacture of field effect transistors (FET) devices. The width of the gate is a design feature that effects maximum chip performance, so it is undesirable to introduce this source of variability. Variations in the width of the gate conductor may reduce the performance of the device to the point that an FET device fails.

Attempts to avoid the formation of an etch differential have resulted in further manufacturing difficulties. For example, in contrast to doping the gate conductor prior to etching, attempts have been made to dope the gate conductor following the etch. By doping the gate conductor region following etching, the source and drain regions of a device are exposed to the gate conductor dopant. Introducing gate dopants to the source and drain regions can adversely affect source/drain engineering.

In order to selectively implant the gate conductor and not degrade the optimized source and drain doping profile for the device performance, it is necessary to mask the areas of the source and drain in close proximity to the gate region, while leaving the tops of the gate conductor exposed to allow ion implantation of the gate dopant. Attempts to selectively implant the gate conductor while protecting the critical source/drain regions, especially when implanting multiple nested gate regions, have not accomplished the above requirements.

Conventionally, a gate dopant-masking layer 15 has been provided using a spin-on polymer that is blanket deposited atop a substrate 20 including gate regions 21, 22, as depicted in FIG. 1. The gate dopant-masking layer 15 is then etched back to expose the top surface of the gate regions 21, 22, as depicted in FIG. 2. Conventionally, etching the dopant-masking layer 15 atop gate regions 21,22 also exposes the surface of the substrate 20, which later becomes the source and drain regions of the device. The surface of the substrate is exposed because when the spin-on polymer is applied to regions of the wafer having nested gate regions 21 the thickness $T_1$ of the dopant-masking layer 15 atop the nested gate region 21 is very close to the thickness $T_2$ of the dopant-masking layer 15 atop the surface of the substrate 20. Therefore, since timed etch processes subject the entire masking layer 15 to the same etch rate, removing the dopant masking layer 15 atop the gate region 21 also removes the dopant masking layer 15 from regions of the substrate 20 having the same thickness as the dopant masking layer 15 atop the gate region 22.

Nested gated regions 21 are less sensitive to exposing the substrate 20 during etch back since, depending on the viscosity of the spin-on polymer, the thickness $T_3$ of the dopant masking layer 15 positioned in the spaces between the tightly nested gates 21 is greater than the thickness of the dopant masking layer atop the substrate $T_2$ or atop the gate regions $T_1$. Therefore, etch back of the masking layer 15 in tightly nested gate conductor regions 21 may mask the substrate between the gate conductor structures of the tightly nested gate regions 21, as depicted in FIG. 2. Substrate masking between gate conductor structures of tightly nested gate regions is a function of the distance separating gate regions; the width of the gate conductor in the gate region; and the viscosity of the spin-on polymer solution being applied. The smaller the dimension separating adjacent gate regions, the smaller the gate conductor, and the higher the viscosity of the spin-on polymer, the higher the likelihood of substrate masking in tightly nested gate conductor regions.

In view of the above, a method of doping a gate region, which is not subjected to the disadvantages of etch bias differential encountered using conventional processing methods, and does not introduce gate conductor dopants to the source and drain regions of the device is needed. A method is also needed of providing a gate conductor dopant mask atop regions of the substrate that are in close proximity to the gate conductor of the device.

SUMMARY OF THE INVENTION

An objective of the present invention is to provide a method of selectively implanting the gate region of a semiconducting device that does not introduce an etch rate differential to the gate conductor prior to gate region formation steps, i.e., etch, and does not introduce gate conductor dopants into the critical area of the source/drain region of the substrate.

The present invention, advantageously provides a method for manufacturing a semiconductor device; in which the gate conductor of the device is implanted following gate region etch. In the present invention, selective growth of liquid phase deposition (LPD) oxide on an exterior oxide surface of a spacer flanking the sidewalls of the gate conductor and gate dielectric form a protective mask for the p-type and n-type diffusion regions. The liquid phase deposited oxide does not grow on the silicon surfaces; therefore the top surface of the gate conductor is exposed. More specifically, the present method of implanting a gate conductor region comprises:

forming at least one polysilicon gate atop a substrate;

forming at least one set of spacers abutting at least one polysilicon gate, said at least one set of spacers having an exterior oxide surface;

forming source/drain oxide spacers by liquid phase deposition, the source/drain oxide spacers being selectively deposited on the exterior oxide surface of at least the one set of spacers, wherein a top surface of at least one polysilicon gate is exposed; and implanting at least one polysilicon gate, wherein source/drain oxide spacers protect an underlying portion of the substrate.

During gate implantation, the source/drain oxide spacers protect the underlying source/drain regions of the substrate. Source/drain oxide spacers are selectively deposited by liquid phase deposition on an exterior oxide surface of at least one spacer until the source/drain oxide spacer width $W_3$ is on the order of about 20.0 nm to about 150.0 nm. The source/drain oxide spacers may comprise liquid phase deposited $SiO_2$ (oxide). The source/drain oxide spacers may also comprise liquid phase deposited SiOF comprising a fluorine atom concentration less than 10.0 atomic %, preferably less than approximately 7.0 atomic %, more preferably less than 5.0 atomic %, and even more preferably less than 3.0 atomic %.

Liquid phase deposition requires that an oxide be present as a bonding site. Therefore, despite the number of spacers functioning as etch stops or as an offset to compensate for the different diffusion rates of the different dopant species, the outermost spacer must include an exterior oxide surface to function as the bonding site for liquid phase deposited (LPD) oxide, i.e., $LPD-SiO_2$. The exterior oxide surface may be the surface of an oxide spacer or an oxide seed layer formed on the surface of a spacer comprising a material other than oxide, i.e., nitride spacers. Further, oxide material is not deposited atop the polysilicon gate conductor or atop the Si substrate surface. To ensure that liquid phase deposited oxide is not formed atop the Si substrate, the substrate may be treated using a chemical cleaning process to remove any native oxide from the substrate surface.

The source/drain oxide spacer may be deposited by liquid phase deposition by dipping the substrate in a supersaturated hydrofluosilicic acid ($H_3SiF_6$). The supersaturated hydrofluosilicic acid ($H_3SiF_6$) is produced by adding aqueous boric acid ($H_3BO_3$) to a saturated hydrofluosilicic acid ($H_3SiF_6$) until a precipitate is formed, wherein the precipitate is adsorbed by an exterior oxide surface of a spacer, forming the source/drain oxide spacer. The saturated hydrofluosilicic acid ($H_3SiF_6$) is produced by adding $SiO_2$ powder to a hydrofluoric acid base until a solution at maximum equilibrium is provided.

Another aspect of the present invention is a method of forming a MOSFET device by selectively doping multiple polysilicon gate regions without introducing gate conductor dopants into regions of the substrate that are subsequently processed to form the critical area of the source/drain diffusion regions. Broadly, the inventive process for selectively doping multiple polysilicon gate regions comprises the steps of:

forming a plurality of polysilicon gates on a substrate;

providing doped regions in the substrate;

forming source/drain oxide spacers by liquid phase deposition, the source/drain oxide spacers being selectively deposited on an exterior oxide portion of at least one set of spacers flanking at least one of the plurality of polysilicon gates;

forming a block mask overlying a device region including a portion of the plurality of polysilicon gates, wherein another device region including an exposed portion of the plurality of polysilicon gates is implanted with a first type dopant;

removing the block mask;

applying another block mask overlying previously doped polysilicon gates, wherein another exposed portion of the plurality of polysilicon gates are implanted with a second dopant;

removing the other block mask;

stripping the source/drain oxide spacers;

activating the doped regions and the plurality of polysilicon gates; and providing interconnectivity to the source/drain region and the plurality of polysilicon gates.

The gate conductors may be selectively doped using n-type or p-type dopants. The p-type dopant may be a group III element. The n-type dopant may be a group V element. The gate regions may be selectively processed using block masks produced using conventional photolithography processing steps. The block mask may be formed by depositing a layer of photoresist and then patterning the layer of photoresist to form the block mask. During gate conductor implantation, block masks may be utilized to protect underlying gate and source/drain regions from being implanted thus allowing for selectivity during implant process steps.

A further aspect of the present invention is a method of doping the gate regions and source/drain regions of multiple device regions utilizing a reduced number of block masks. In broad terms, the inventive method comprises:

forming a plurality of polysilicon gate structures on a substrate;

forming source/drain extension regions in the substrate;

forming source/drain oxide spacers by liquid phase deposition, said source/drain oxide spacers selectively deposited on an exterior oxide surface of at least one set of spacer abutting said plurality of polysilicon gate structures;

implanting dopants into said at least one polysilicon gate region and a deep source/drain region in said substrate, said deep source/drain region laterally spaced from said polysilicon gate structure by said source/drain oxide spacers, wherein a portion of said substrate underlying said source/drain oxide spacers is protected;

removing said source/drain oxide spacers; and implanting said source/drain diffusion regions in said substrate laterally spacer from said polysilicon gate structure by said at least one set of spacers.

The above methods reduce the number of masking steps required for processing multiple device regions. Block masks allow for selectively processing specific device regions, where the block mask protects the region of the substrate that is not intended to be processed. Following block mask formation, the selected device region may be first implanted to dope the polysilicon gate and form deep source/drain regions laterally spaced from the polysilicon gate by source/drain oxide spacers. Following gate conductor implant the source/drain oxide spacers may be removed from the implanted region using a selective etch process. Source/drain oxide spacers positioned in the device region underlying the block masks are protected from the selective etch. Following source/drain oxide spacer removal, the selected device region is implanted to form source/drain diffusion regions, where the same block mask utilized during the gate conductor implant protects the non-selected region from the source/drain diffusion implant. Following source/drain diffusion formation, the first block mask is removed and another block mask is formed atop and protecting the previously implanted device region. A second device region is then implanted, where the second block mask protects the previously implanted device region during second device region gate conductor, deep source/drain, and source/drain diffusion implant. By utilizing the same block mask during gate conductor, deep source/drain, and source/drain diffusion implant the number of block masks required for processing multiple device regions is reduced.

A further aspect of the present invention is the MOSFET structure produced using the above methods. Broadly, the inventive MOSFET comprises:

a doped polysilicon gate region having a gate dopant concentration ranging from about $5\times10^{19}$ atoms/cm$^3$ to about $5\times10^{21}$ atoms/cm$^3$; and a substrate including source/drain diffusion regions flanking the doped polysilicon gate region having a dopant concentration of about $1\times10^{19}$ atoms/cm$^3$ to about $1\times10^{21}$ atoms/cm$^3$ at a depth ranging from 10.0 nm to 100.0 nm from the substrate surface, and deep source/drain regions at distances greater than approximately 200.0 nm from said doped polysilicon gate region, said gate dopant regions of said substrate having a dopant concentration of $1\times10^{19}$ atoms/cm$^3$ to about $1\times10^{21}$ atoms/cm$^3$ at a depth ranging from about 50.0 nm to about 200.0 nm.

The MOSFET may further comprise source/drain extension regions extending below said doped polysilicon gate region, where said source/drain extension regions have a dopant concentration of about $1\times10^{19}$ atoms/cm$^3$ to about $1\times10^{21}$ atoms/cm$^3$ at a depth ranging from 1.0 nm to about 30.0 nm.

Alternatively, the MOSFET may comprise a silicon-on-insulator (SOI) substrate, where the gate dopant regions in the substrate extend through the Si layer and terminate on a layer of insulator material, preferably being a buried oxide. In this embodiment, the gate dopant regions have a thickness equal to the thickness of the Si layer that may range from 10.0 nm to 150.0 nm, preferably ranging from 30.0 nm to 100.0 nm.

DETAILED DESCRIPTION OF THE INVENTION

Figure 1:
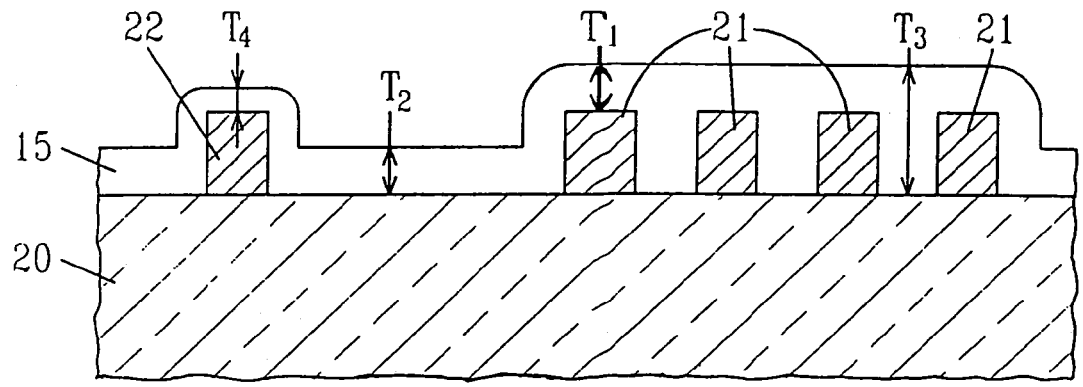
FIGS. 1 and 2 depict a prior art method of doping a gate implant using a spin on barrier layer, which does not effectively block the dopant from being introduced to the substrate.
Figure 2:
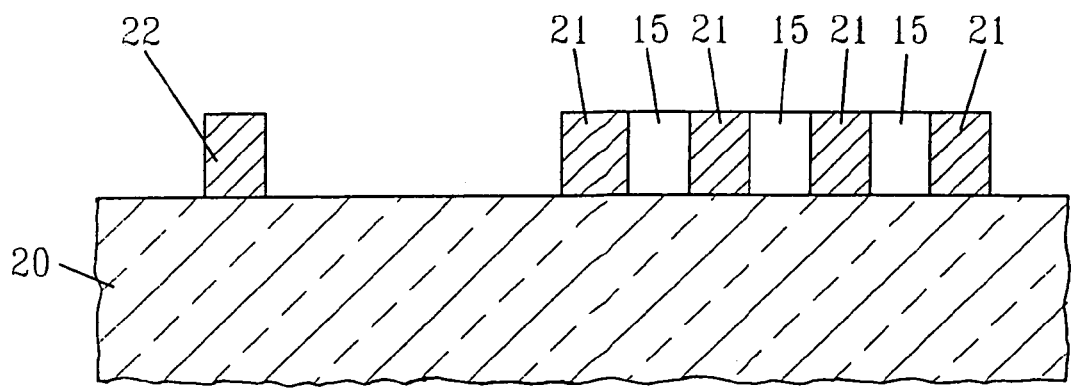

The present invention provides a method of selectively doping polysilicon gate conductors, following gate region etching, without introducing gate conductor dopants into substrate regions that are in close proximity to the gate region of the device. The present invention is now discussed in more detail by referring to the drawings that accompany the present application. It is noted that in the accompanying drawings like and or corresponding elements are referred to by like reference numbers.

Figure 3:
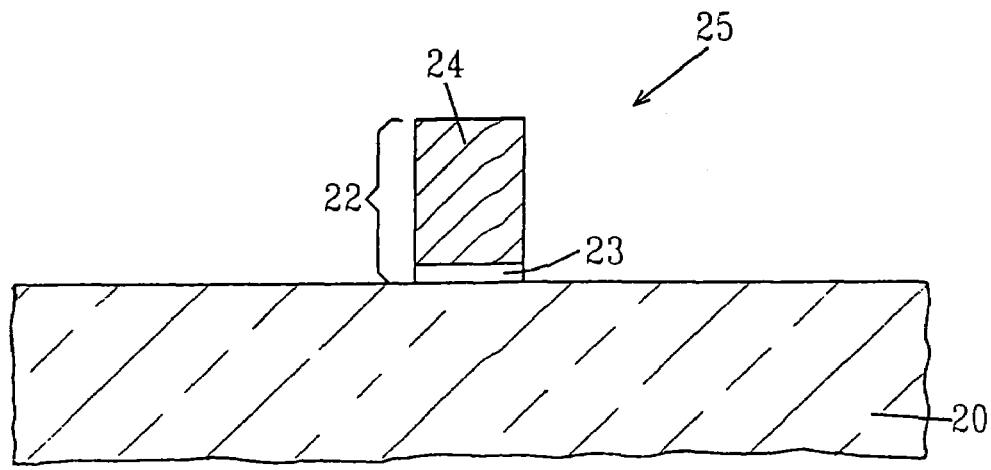
FIG. 3 illustrates (through a cross-sectional view) the results of initial processing steps including the deposition of a gate dielectric and polysilicon gate atop a semiconductor substrate.

An initial structure 25 is first provided having at least one polysilicon gate region 22. Each polysilicon gate region 22 includes a polysilicon gate 24 atop a gate dielectric 23 that is positioned on a substrate 20, as depicted in FIG. 3.

The initial structure 25 is formed by first forming a layer of gate dielectric 23, such as an oxide, nitride, oxynitride or any combination thereof, atop the surface of a substrate 20. The substrate 20 includes, but is not limited to: any semiconducting material such as single crystal Si, single crystal SiGe, SOI (silicon-on insulator), or SiGeOI (silicon germanium on insulator) and other like semiconductors. The substrate 20 may also include isolation regions (not shown)i such as shallow trench isolation (STI) or field oxide regions (FOX). The STI regions are formed by etching a trench in the substrate 20 utilizing a conventional dry etching process such as reactive-ion etching (RIE). The trenches may optionally be lined with a conventional liner material, e.g., an oxide, and then CVD or another like deposition process is used to fill the trench with a trench dielectric material. The trench dielectric material may be optionally densified after deposition. A conventional planarization process such as chemical-mechanical polishing (CMP) may be used to provide a planar structure. The FOX regions are formed by local oxidation of silicon (LOCOS) process.

The gate dielectric 23 may be formed by a conventional deposition process such as chemical vapor deposition (CVD), plasma-assisted CVD, evaporation and chemical solution deposition, or alternatively, a conventional thermal process such as oxidation, nitridation, and local oxynitridation, may be used in growing the gate dielectric 23 on the surface of the semiconductor substrate 20. The thickness of the gate dielectric 23 is not critical to the present invention, but typically, the gate dielectric 23 has a thickness from about 1.0 nm to about 10.0 nm, with a thickness from about 1.5 nm to about 2.5 nm more highly preferred. It is noted that the gate dielectric 23 employed in the present invention may be a conventional dielectric material such as $SiO_2$, $SiO_xN_y$, $Si_3N_4$, or alternatively high-k dielectrics such as oxides of Hf, Zr, Al or combinations thereof may be employed.

Following the formation of the gate dielectric 23, a layer of polysilicon 24 is deposited as a gate conductor material. Alternatively, the gate conductor is SiGe, SiGeC or other Si-containing materials. A polysilicon gate region 22 is then formed using conventional photolithography and etching. Specifically, a pattern is produced by applying a photoresist to the surface to be etched; exposing the photoresist to a pattern of radiation; and then developing the pattern into the photoresist utilizing a conventional resist developer. Once the patterning of the photoresist is completed, the sections covered by the photoresist are protected while the exposed regions are removed using a selective etching process that removes the unprotected regions.

Figure 4:
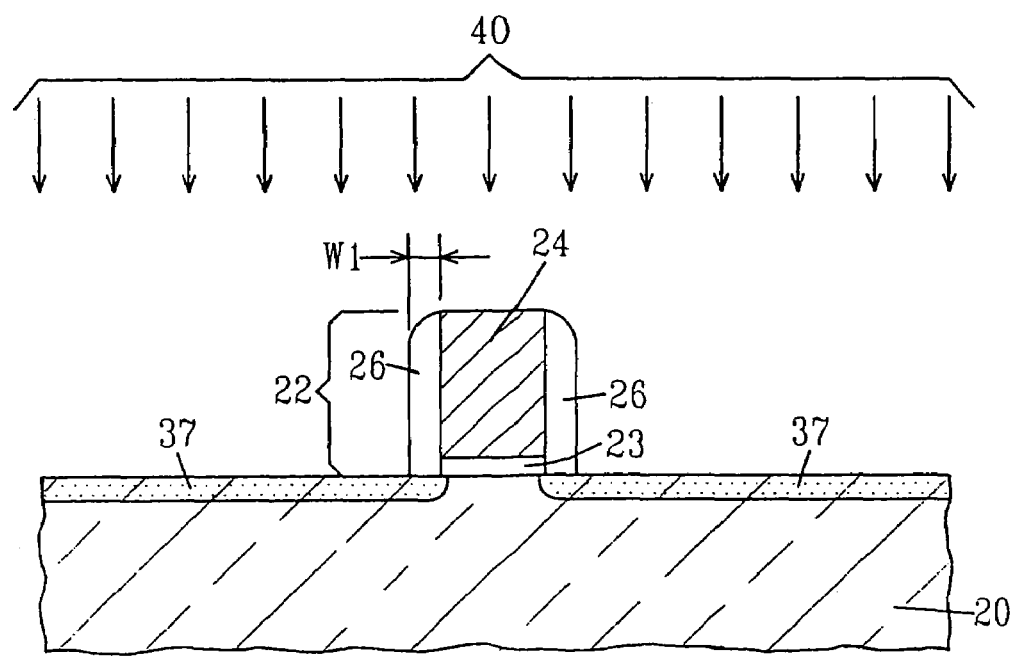
FIG. 4 illustrates (through a cross-sectional view) the formation of a first set of spacers abutting the gate region and the formation of source/drain extension regions.

Referring to FIG. 4, a set of first spacers 26 are formed along the sidewall of the gate region 22, including the polysilicon gate 24 and the gate dielectric 23. Each spacer of the set of first spacers 26 has a width W1 ranging from about 1.0 nm to about 15.0 nm. A preferred first spacer 26 width for implanting n-type extension regions ranges from about 1.0 nm to about 5.0 nm. A preferred spacer width for implanting p-type extension regions is on the order of 15.0 nm or less.

The first spacers 26 are preferably composed of oxide, i.e., $SiO_2$, but may also comprise nitride or oxynitride materials. The first spacers 26 may be formed by conventional deposition and etch processes. For example, a conformal layer may be deposited using conventional deposition processes, including, but not limited to: chemical vapor deposition (CVD), plasma-assisted CVD, and low-pressure chemical vapor deposition (LPCVD). The conformal layer may also be formed by thermal oxidation or thermal nitridation.

Following deposition, the conformal layer is then etched using an anisotropic plasma etch procedure such as, but not limited to: reactive ion etching. The gas chemistry utilized for etching the preferred spacers may be fluorine containing gasses having high selectivity to removing oxide including, but not limited to: $CF_4$, $SiF_4$, $NF_3$, $CHF_3$, $C_4F_8$, $C_3F_8$ and $C_2F_6$. The resulting spacers 26 are depicted in FIG. 4.

In one embodiment, the first spacer 26 may subsequently be the bonding site for liquid phase deposition oxide during the formation of source/drain oxide spacers 28. In this embodiment, the first spacer 26 maybe an oxide or alternatively be a material other than oxide, i.e., nitride, having an oxide seed layer disposed on the outer surface of the spacer, so long as the first spacer includes an exterior oxide surface to provide a bonding site for liquid phase deposition. The oxide seed layer is preferably $SiO_2$, but may alternatively comprise similar oxide materials. The oxide seed layer may be formed using a conventional deposition process, including but not limited to: chemical vapor deposition (CVD), plasma-assisted CVD, and low-pressure chemical vapor deposition (LPCVD). The oxide seed layer may also be formed using thermal oxidation. In one embodiment, the oxide seed layer may comprise $SiO_2$ deposited from a tetraethylorthosilicate (TEOS) source, which may include the addition of ozone ($O_3$).

Source/drain extension regions 37 are then formed using an ion implantation process step 40 that is well known within the skill of the art. More specifically, when forming p-type extension regions a typical dopant species is boron or $BF_2$. Boron may be implanted utilizing implant energies on the order of about 0.2 keV to about 3.0 keV with an implant dose of about $5 \times 10^{14}$ atoms/cm to about $5 \times 10^{15}$ atoms/cm$^2$. $BF_2$ may be implanted utilizing implant energies on the order of about 1.0 keV to about 15.0 keV and a dose of about $5 \times 10^{14}$ atoms/cm$^2$ to about $5 \times 10^{15}$ atoms/cm$^2$. A typical implant for the n-type extension regions is arsenic. The n-type extension regions can be implanted with arsenic using implant energies on the order of about 1.0 keV to 10.0 keV with a dose of about $5 \times 10^{14}$ atoms/cm$^2$ to about $5 \times 10^{15}$ atoms/cm$^2$.

Following source/drain extension implantation, the structure may be annealed to promote diffusion of the dopant species. The extension regions are activated by a conventional annealing process, i.e., rapid thermal anneal, as well known by those having ordinary skill in the art. In one example, the rapid thermal annealing temperature is carried out using a temperature of 750° C. to about 1200° C. for a time period of about 1.0 second to about 20.0 seconds. Preferably, the anneal process may-be conducted following the completion of all of the implant processing steps to reduce the thermal budget of the manufacturing process.

In a next processing step, source/drain diffusion regions 38 may be formed using an ion implantation processing step 41. Prior to source/drain diffusion implantation, a second set of spacers 42 may be formed. The second set of spacers 42 are formed abutting the first set of spacers 26. Each spacer of the second set of spacers 42 has a width W2 ranging from about 50.0 nm to about 100.0 nm.

The second set of spacers 42 are preferably composed of oxide, i.e. $SiO_2$, but may also comprise nitride or oxynitride materials. The second set of spacers 42 may be formed by conventional deposition and etch processes. For example, a conformal oxide layer may be deposited using conventional deposition processes, including, but not limited to: chemical vapor deposition (CVD), plasma-assisted CVD, and low-pressure chemical vapor deposition (LPCVD).

Figure 5:
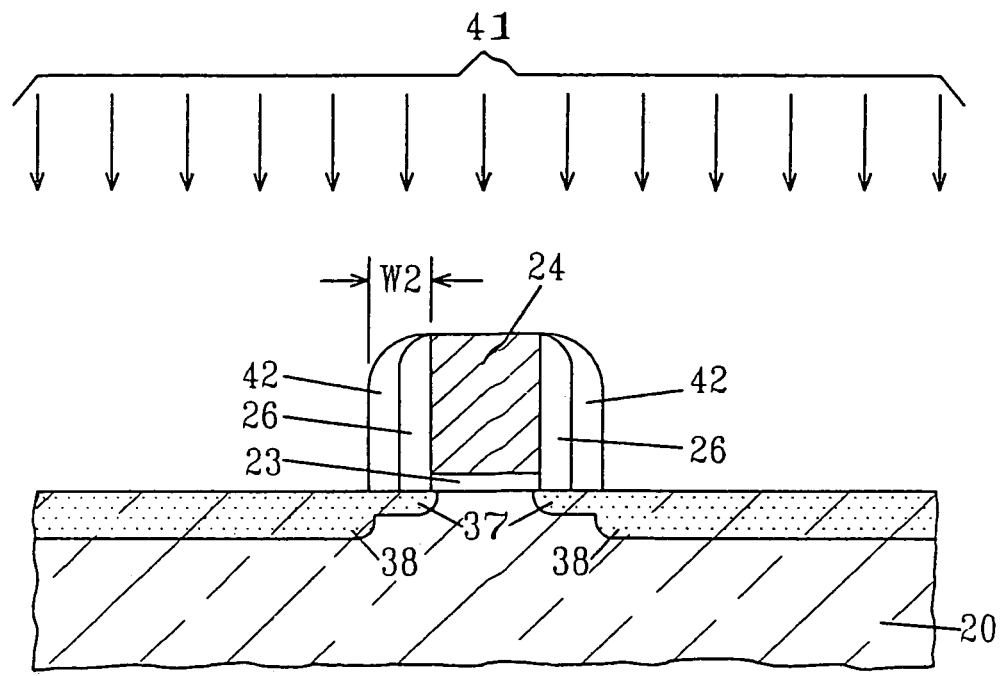
FIG. 5 illustrates (through a cross-sectional view) the formation of another set of spacers abutting the first set of spacers and source/drain regions

Following deposition, the conformal oxide layer is then etched using an anisotropic plasma etch procedure such as, but not limited to: reactive ion etch. The gas chemistry utilized for etching the preferred oxide offset spacers 42 may be fluorine containing gasses having high selectivity to removing oxide including, but not limited to: $CF_4$, $C_3F_8$, $C_4F_8$, $NF_3$, $CHF_3$ and $SiF_4$. The resulting second set of spacers 42 which can be referred to as offset spacers are depicted in FIG. 5.

Source/drain diffusion regions 38 are then implanted. Typical implant species for the n-source/drain region may phosphorus or arsenic. The n-type source/drain diffusion region 38 may be implanted with phosphorus using an energy of about 3.0 keV to about 15.0 keV with a dose of about $1 \times 10^{15}$ atoms/cm$^2$ to about 733 $10^{15}$ atoms/cm$^2$. The n-type source/drain diffusion region 38 may be implanted with arsenic using an energy of about 6.0 keV to 30.0 keV with a dose of about $1 \times 10^5$ atoms/cm$^2$ to about $7 \times 10^{15}$ atoms/cm$^2$. Typical implant species for the p-type region maybe boron or $BF_2$. The p-type source/drain diffusion region 38 can be implanted with boron utilizing an energy of about 1.0 keV to 8.0 keV with a dose of about $1 \times 10^{15}$ atoms/cm$^2$ to about $7 \times 10^{15}$ atoms/cm$^2$. The p-type source/drain diffusion region 38 may also be implanted with $BF_2$ with an implant energy of about 5.0 keV to about 40.0 keV and a dose of about $1 \times 10^{15}$ atoms/cm$^2$ to about $7 \times 10^{15}$ atoms/cm$^2$.

Following source/drain diffusion region 38 implantation, the structure may be annealed to promote diffusion of the dopant species using anneal process conditions well known within the skill of the art. Preferably, the anneal process step may be conducted following the completion of all of the implant processing steps to reduce the thermal budget of the manufacturing process.

A cleaning process is then typically employed to remove any native oxide from the exposed Si surfaces of the substrate 20. The cleaning process may include a diluted HF chemical clean composed of 100 parts deionized water to 1 part HF, where the HF concentration is approximately 49%. The cleaning process may also include a two-part chemical clean including a first solution of hydrogen peroxide, ammonium hydroxide, and water followed by a second solution of hydrogen peroxide, hydrochloric acid and water.

Figure 6:
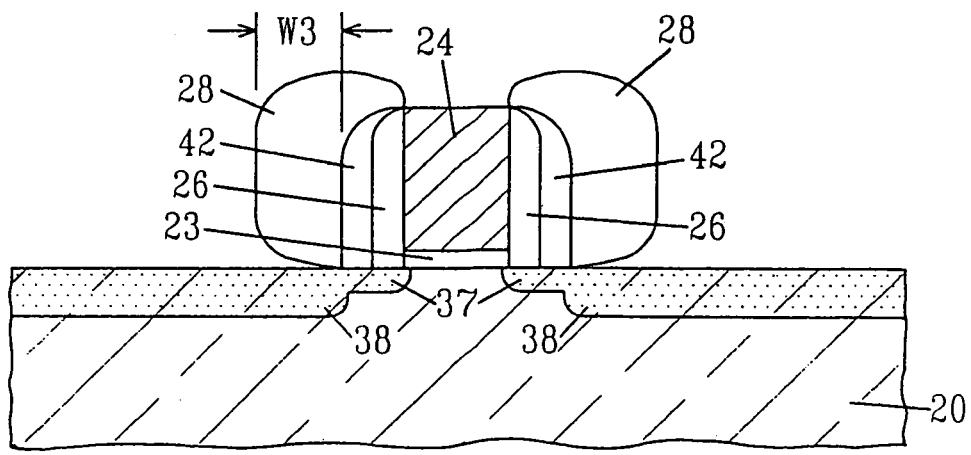
FIG. 6 illustrates (through cross-sectional view) the formation of source/drain oxide spacers abutting the second set of spacers.

A source/drain oxide spacer 28 is then formed on the exterior oxide surfaces of the second set of spacers 42 using a liquid phase deposition process (LPD), as depicted in FIG. 6. In an alternate embodiment, a source/drain oxide spacer 28 is formed on the exterior oxide surface of the first set of spacers 26. Liquid phase deposition provides a uniform and dense source/drain oxide spacer 28 that is selectively grown on oxide material. The oxide material is preferably a spacer of having an oxide composition or is alternatively a nitride spacer having an oxide seed layer as an exterior surface.

Figure 7:
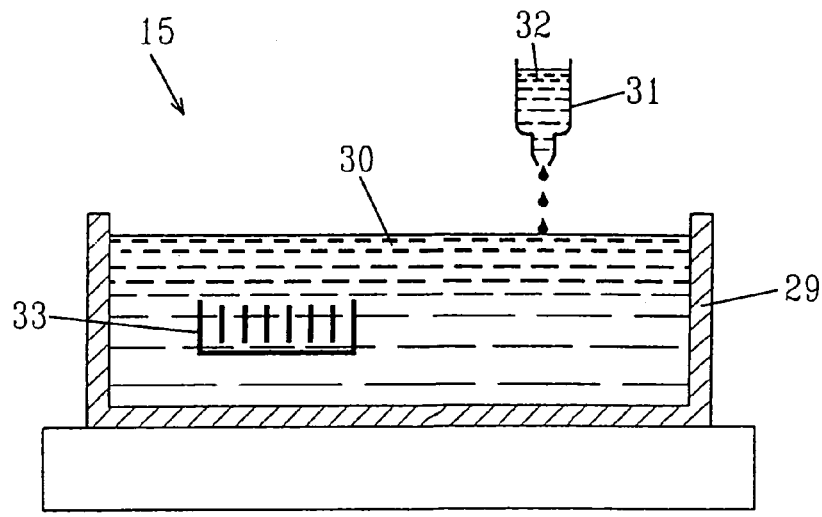
FIG. 7 illustrates a liquid phase deposition apparatus.

A liquid phase deposition apparatus 15, depicted in FIG. 7, may include a vessel 29, accommodating an aqueous solution of saturated hydrofluosilicic acid ($H_3SiF_6$) 30; a wafer carrier 31 that can be immersed into the solution 30; and titration system 31 for introducing a controlled amount of boric acid ($H_3BO_3$) aqueous solution 32.

The saturated hydrofluosilicic acid ($H_3SiF_6$) 30 is produced using hydrofluoric acid as a base solution to which pure $SiO_2$ powder is introduced until the solution reaches a state of maximum equilibrium quantity of dissolved matter, where further addition of $SiO_2$ will not dissolve. The saturation is maintained at a controlled temperature and mixing rate. The temperature may range from about 0.0° C. to about 35.0° C. In one embodiment the mixing rate was maintained at 500 rpm's using a magnetic stirrer.

Figure 8A:
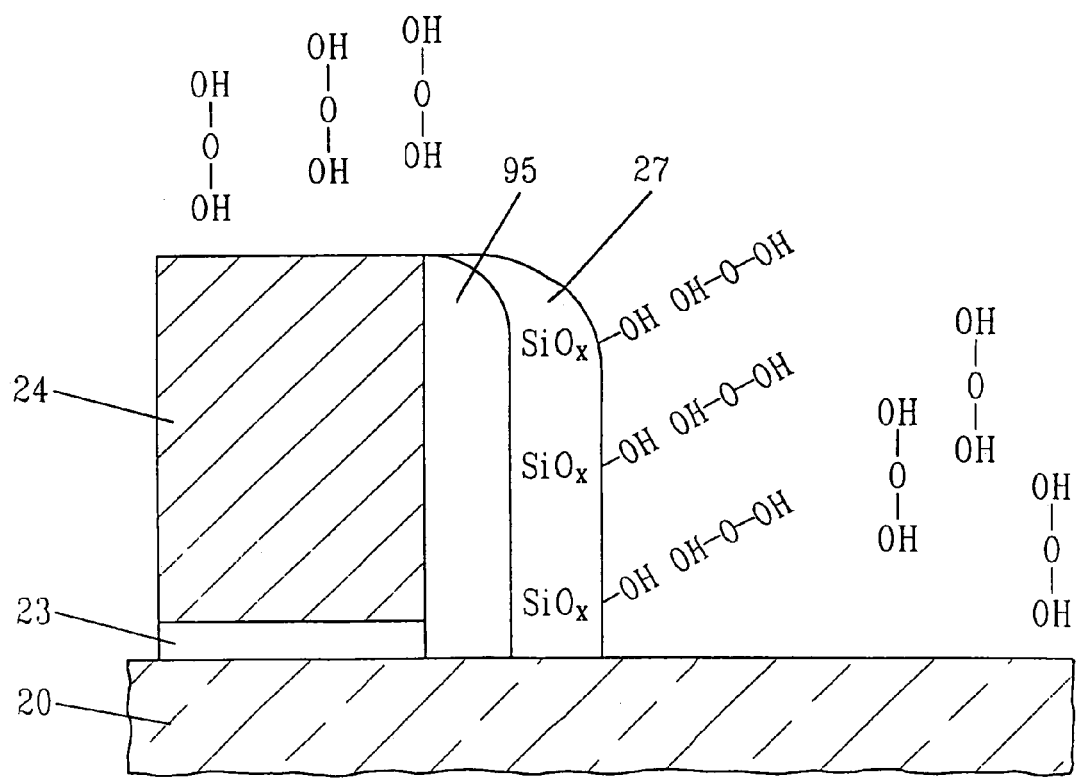
FIGS. 8(a)-(c) are pictorial representations of the surface reaction between an exterior oxide surface of a spacer and the precipitate formed from the liquid phase deposition process of the current invention.
Figure 8B:
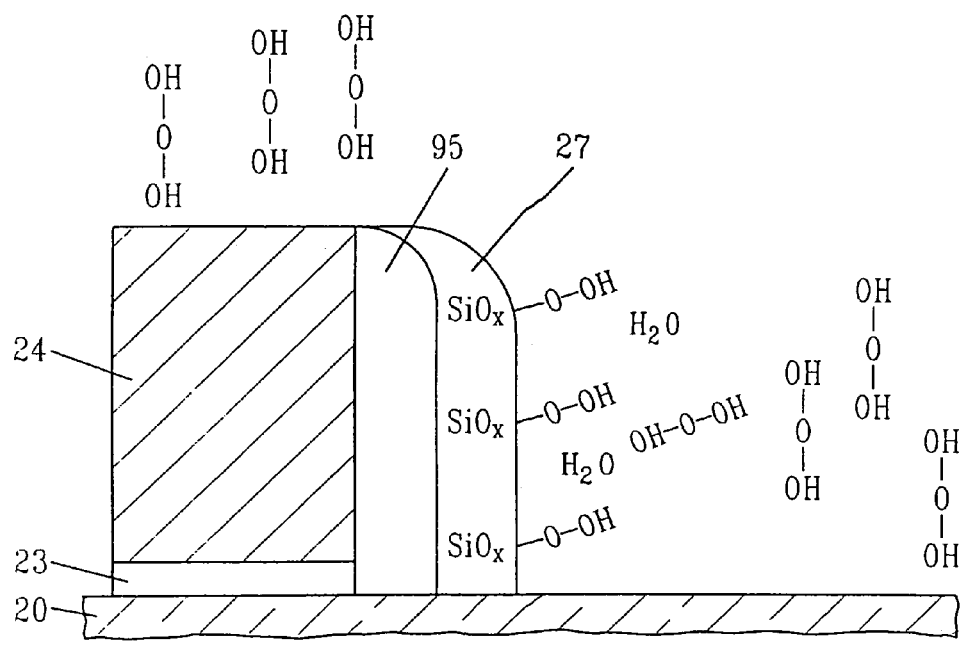
Figure 8C:
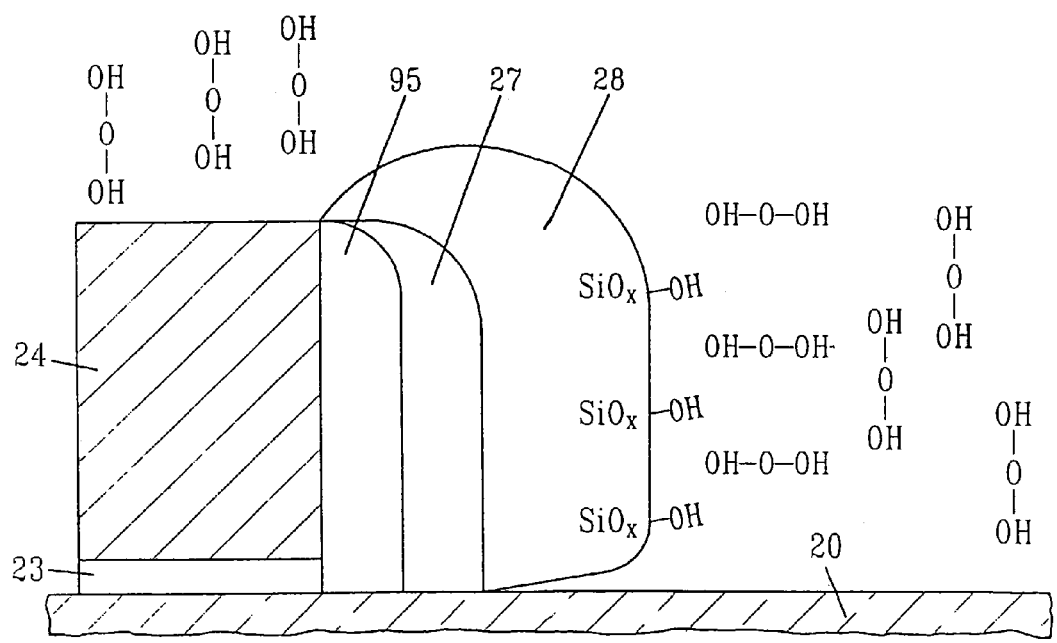

The saturated hydrofluosilicic acid ($H_3SiF_6$) is then transferred through a strainer (not shown) to ensure that any undissolved material is removed, into vessel 29 of the liquid phase deposition apparatus 15. The wafer is then positioned within the wafer carrier 31 and dipped into the hydrofluosilicic acid ($H_3SiF_6$) 30 to deposit LPD $SiO_2$ atop the oxide surface of the first set of spacers 26 forming source/drain oxide spacer 28, as depicted in FIGS. 8(a)-(c).

To maintain saturated hydrofluosilicic acid ($H_3SiF_6$), supersaturated pure boric acid ($H_3BO_3$) may be added to the saturated hydrofluosilicic acid, where the solvent contains more dissolved matter or solute ($SiO_2$) than present in the saturated solution of the same components. The supersaturated hydrofluosilicic acid may precipitate and deposit $SiO_2$ upon further addition $H_3BO_3$ or any slight agitation, such as mixing. Therefore, the rate of precipitation is a function of $H_3BO_3$ titration. Additionally, deposition rate may also be increased by increasing temperature of the hydrofluosilicic acid ($H_3SiF_6$) or by increasing the mixing rate. The chemical reactions for liquid phase deposition of $SiO_2$ is as follows:

$$H_2SiF_6 + 2H_2O = 6HF + SiO_2\downarrow \quad [1]$$

$$H_3BO_3 + 4HF = BF_4^- + H_3O^+ + 2H_2O \quad [2]$$

Referring to reaction [1], hydrofluoric acid (HF) is separated from hydrofluosilicic acid ($H_3SiF_6$) by $SiO_2$ precipitate formation. The hydrofluoric acid (HF) is then consumed by boric acid ($H_3BO_3$) and forms boron tetraflouride ions ($BF_4^-$), as shown in formula [2]. Accordingly, with increasing boric acid ($H_3BO_3$) the chemical equilibrium of formula [1] shifts to the right increasing $SiO_2$ precipitate ($SiO_2\downarrow$).

In addition to source/drain oxide spacer 28 comprising precipitated $SiO_2\downarrow$; the source/drain oxide spacer 28 also includes fluorine atoms through Si—F bonds. In the interest of clarity, but without wishing to be limited, liquid phase deposition of $SiO_2$ may further include: (i) hydrolyzing of the silicon halide ($H_3SiF_6$) to form $F_nSi(OH)_{4-n}$ (n=1, 2 or 3) in the saturated ($H_3SiF_6$) solution; (ii) $F_mSi(OH)_{3-m}$—$(F_nSiO_{(4-n)/2})_y$—$F_mSi(OH)_{3-m}$ (m=1 or 2 and y is a positive number) siloxane oligomers being formed in the supersaturated $H_2SiF_6$ solution by catalytic reactions; (iii) the oligomers being adsorbed onto the substrate surface; and (iv) catalytic dehydration occurring between the oligomers and the Si—OH existing at the oxide surface of the offset spacer 42. The dehydration reaction occurring at the-oxide surface may be expressed as follows:

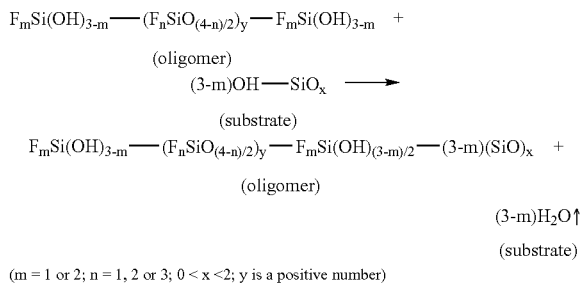

$F_mSi(OH)_{3-m}$—$(F_nSiO_{(4-n)/2})_y$—$F_mSi(OH)_{3-m}$ +
(oligomer)
(3-m)OH—$SiO_x$ ⟶
(substrate)
$F_mSi(OH)_{3-m}$—$(F_nSiO_{(4-n)/2})_y$—$F_mSi(OH)_{(3-m)/2}$—(3-m)(SiO)$_x$ +
(oligomer)
(3-m)$H_2O\uparrow$
(substrate)

(m = 1 or 2; n = 1, 2 or 3; 0 < x < 2; y is a positive number)

The formation of the source/drain oxide spacer 28 by selective deposition of liquid phase deposition oxide on the exterior oxide surface 27 of an offset spacer 95 is further depicted in FIGS. 8(a)-(c). Although FIGS. 8(a)-(c) include only one offset spacer 95, multiple spacers are also contemplated herein, so long as the outermost spacer has an exterior oxide portion 27. For example, the offset spacer 95 may comprise a first set of spacers 26 or a combination of the first set of spacers 26 and a second set of spacers 42.

Referring to FIG. 8(a), liquid phase deposition of the source/drain oxide spacer 28 begins with siloxane oligomers being adsorbed to the Si—OH bonds existing at the oxide surface 27 of the offset spacer 95. Next, a dehydration reaction and chemical bond formation occurs with the $SiO_x$ at the oxide surface 27 of the offset spacer 95, as depicted in FIG. 8(b). Referring to FIG. 8(c), the source/drain oxide spacer 28 selectively forms atop the oxide surface 27 of the offset spacer 95, because liquid phase deposition-$SiO_2$ reacts with the Si—OH bonds of the oxide surface. The liquid phase deposition $SiO_2$ does not react with the polysilicon gate conductor 24 or regions of the substrate 20 surface, since both the polysilicon gate conductor 24 and substrate 20 lack oxide material having Si—OH bonds. Therefore, the surface of the gate conductor 24 remains exposed.

Still referring to FIG. 8(c), the surface of the source/drain oxide spacer 28 is OH terminated, where the OH provides for further adsorption until the thick oxide spacer 28 has a width $W_3$ of approximately 150.0 nm or less. The source/drain oxide spacer 28 may have a width on the order of about 20.0 nm to about 150.0 nm, more preferably ranging from about 50.0 nm to about 100.0 nm, so long as liquid phase deposition $SiO_2$ material does not begin to flare over and cover the polysilicon gate conductor 24. The width of the source/drain oxide spacer 28 effectively protects the underlying source/drain extension regions 37 and a portion of the source/drain diffusion regions 38 of the substrate 20.

Additionally, the oxide grown using liquid phase deposition has a greater porosity and therefore quicker etch rate than oxide formed using conventional deposition or thermal growth processes.

In another embodiment, the saturated hydrofluosilicic acid ($H_3SiF_6$) may be supersaturated by replacing boric acid ($H_3BO_3$) with Al; where reaction [2] is replaced with reaction [3], as follows:

$$H_2SiF_6 + 2H_2O = 6HF + SiO_2 \downarrow \qquad [1]$$

$$Al + 6HF \rightarrow H_3AlF_6 + (3/2)H_2 \qquad [2]$$

In a preferred embodiment, source/drain oxide spacer 28 is $SiO_2$, where the impurity concentration level of fluorine atoms is less than about 5 atomic %

Following liquid phase deposition, an etch process, such as RIE, may be conducted to clean the surface of the polysilicon gate 24 prior to gate conductor doping. Additionally, the source/drain oxide spacer 28 may also be etched back from the polysilicon gate 24 to remove any oxide material which can block the gate conductor implant, such as liquid phase deposition $SiO_2$, which may flare atop the polysilicon gate 24 during source/drain spacer 28 growth.

Figure 9:
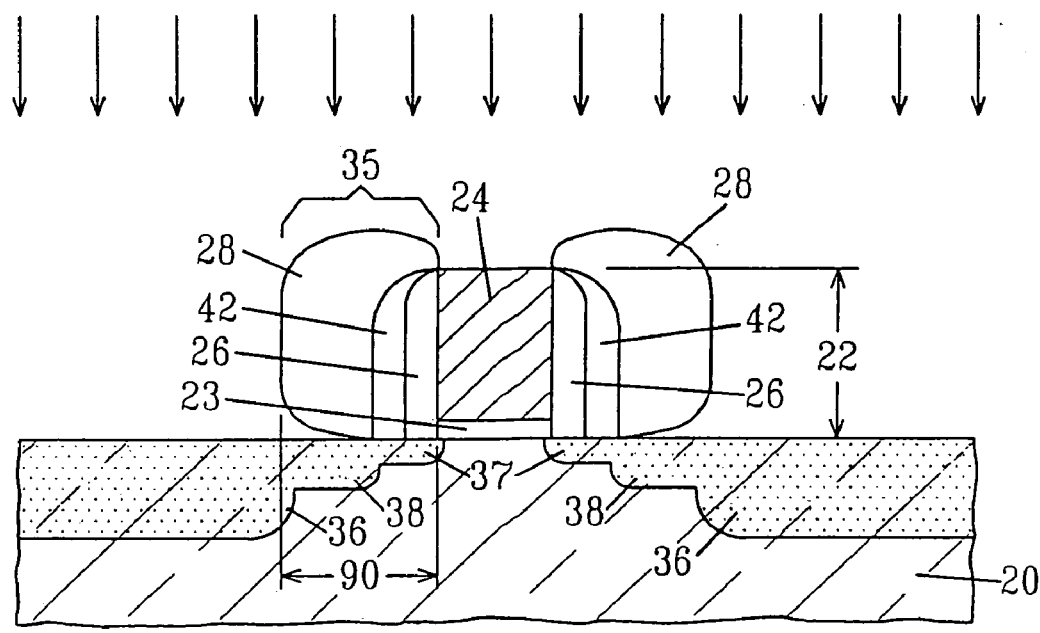
FIG. 9 illustrates (through a cross-sectional view) ion implantation of the structure depicted in FIG. 6 to dope the polysilicon gate conductor.

Now referring to FIG. 9, the polysilicon gate 24 is then doped by ion implantation. During ion implantation, the substrate 20 in close proximity to the gate region 22 is protected from the gate conductor dopant by the first set of spacers 26, second set of spacers 42 and source/drain oxide spacers 28, which collectively form the gate dopant block mask 35 having a thickness of less then about 300.0 nm, preferably ranging from about 40.0 nm to about 300 nm, even more preferably ranging from 100.0 nm to 200.0 nm. Alternatively, the gate dopant block mask. 35 may comprise only first set of spacers 26 and source/drain oxide spacers 28.

The polysilicon gate 24 is then implanted 34 through the exposed top surface to form a n-type or p-type polysilicon gate. Implanting polysilicon with group III elements, i.e., boron, produces p-type polysilicon gates. Implanting polysilicon with group V elements, i.e., arsenic or phosphorus, produces n-type polysilicon gates. A typical gate implant dose for arsenic ranges from about $1 \times 10^{15}$ atoms/$cm^2$ to about $5 \times 10^{15}$ atoms/$cm^2$ at an implant energy ranging from about 10.0 keV to about 30.0 keV. A typical implant dose for phosphorus ranges from about $1 \times 10^{15}$ atoms/$cm^2$ to about $5 \times 10^{15}$ atoms/$cm^2$ at an implant energy ranging from about 5.0 keV to about 20.0 keV. A typical implant dose for boron ranges from about $1 \times 10^{15}$ atoms/$cm^2$ to about $5 \times 10^{15}$ atoms/$cm^2$ at an implant energy of about 4.0 keV to about 10. keV. The gate implant extends through the polysilicon gate 24 having a thickness ranging from 10.0 nm to about 200.0 nm, preferably ranging from about 75.0 nm to about 150.0 nm.

Although the regions 90 of the substrate 20 within less than about 300.0 nm from the gate region 22 are protected by the overlying gate dopant block mask 35, the exposed portion of the substrate 20 extending further from the gate region 22 beyond the protection of the block mask 35 is exposed to the gate conductor implant. Therefore, a region 36 greater than 300.0 nm distance from the gate region 22 is implanted with high energy, high concentration, gate conductor dopant forming deep source/drain regions 36 within the substrate 20.

The preferred dopant profile includes deep source/drain regions 36 having a depth ranging from approximately 50.0 nm to approximately 200.0 nm, and preferably having a depth ranging from about 75.0 nm to about 150.0 nm, where the dopant concentration of the deep source/drain region 36 ranges from about $1 \times 10^{19}$ atoms/$cm^3$ to about $1 \times 10^{21}$ atoms/$cm^3$, preferably being about $5 \times 10^{19}$ atoms/cm to about $5 \times 10^{20}$ atoms/$cm^3$. The dopant profile of the present invention further includes source/drain diffusion regions 38 having a depth ranging from about 10.0 nm to about 100.0 nm, and preferably having a depth ranging from about 20.0 nm to about 50.0 nm, where the dopant concentration of the source/drain diffusion regions 38 ranges from about $1 \times 10^{19}$ atoms/$cm^3$ to about $1 \times 10^{21}$ atoms/$cm^3$, preferably being about $5 \times 10^{19}$ atom/$cm^3$ to about $5 \times 10^{20}$ atoms/$cm^3$. The dopant profile of the present invention further comprises source/drain extension regions 37 having a depth ranging from about 1.0 nm to about 30.0 nm, and preferably having a depth ranging from about 5.0 nm to about 20.0 nm, where the dopant concentration of the source/drain extension regions 37 ranges from about $1 \times 10^{19}$ atoms/$cm^3$ to about $1 \times 10^{21}$ atoms/$cm^3$, preferably being about $5 \times 10^{19}$ atoms/$cm^3$ to about $5 \times 10^{20}$ atoms/$cm^3$.

Figure 10:
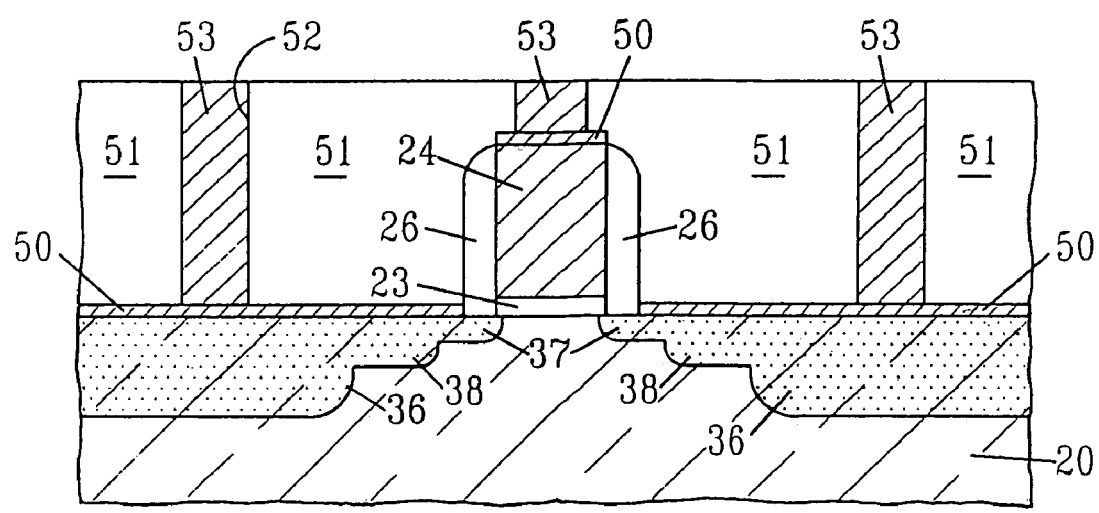
FIG. 10 depicts the structure of the present invention following spacer and source/drain oxide spacer removal.

Referring now to FIG. 10, the thick source/drain spacer 28 is then stripped using diluted HF. The source/drain oxide spacer 28 formed by liquid phase deposition has a high porosity and a rapid etch rate by diluted HF. Therefore, the source/drain oxide spacer 28 etches at a much faster rate than densified oxide, which may be present in offset spacers 42 and shallow trench isolation regions.

Following thick source/drain spacer 28 strip, the structure is annealed to activate the dopants. The dopants may be activated by conventional annealing processes, i.e., rapid thermal anneal, as well known by those having ordinary skill in the art. In one example, the rapid thermal annealing temperature is carried out using a temperature of 1000° C. to about 1100° C. for a time period of less than about 10.0 seconds.

Following the dopant activation anneal, conventional interconnect processing is conducted as well known within the skill of the art; i.e., silicide formation, via formation, and interconnect wiring. More specifically, silicide regions 50 may be formed atop source/drain diffusion regions 38, deep source/drain diffusion regions 36 and gate conductor 24. Silicide formation typically requires depositing a refractory metal such as Ni, Co, or Ti onto the surface of a Si-containing material or wafer. Following deposition, the structure is then subjected to an annealing step using conventional processes such as, but not limited to, rapid thermal annealing. During thermal annealing, the deposited metal reacts with Si forming a metal silicide.

Following silicide formation, a layer of dielectric material is blanket deposited atop the entire substrate and planarized.

The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable The blanket dielectric may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to form via holes to the various source/drain and gate conductor regions of the substrate. Following via formation interconnects are formed by depositing a conductive metal into the via holes using conventional processing, such as CVD or plating. The conductive metal may include, but is not limited to: tungsten, copper, aluminum, silver, gold, and alloys thereof.

Although the present invention has been depicted using a single gate region 22 for the purposes of clarity, multiple gate regions may be processed on a single substrate using conventional patterning techniques well known within the art. For example, a block-mask provided by patterned photoresist can be used prior to implantation to preselect the substrate area for gate conductor doping with one dopant type. The block-mask application and implantation procedure can be repeated to dope selected gate conductors 24, source/drain diffusion regions 38, deep source/drain regions 36, or source/drain extension regions 37 with different dopant types, such as n-type or p-type dopant. After each implant the block mask resist may be removed using convention photoresist strip chemistries.

More specifically, a layer of photoresist is deposited atop the entire structure. The photoresist layer is then selectively exposed to light and developed to pattern a block mask, protecting at least one first region of the substrate and exposing at least one second region of the substrate. The exposed regions of the device are then processed while the regions underlying the block mask are protected. Following processing of the first region, the block mask is removed by conventional stripping techniques. Another block mask may then be formed and utilized for processing another region of the substrate.

Utilizing block masks, multiple gate conductor regions may be selectively processed using the above-described process for doping a single gate conductor region, as depicted in FIGS. 3-6, 9 and 10. The above process conditions utilized to dope a single gate conductor region are now applied to multiple gate regions with reference to FIGS. 11-17.

Figure 11:
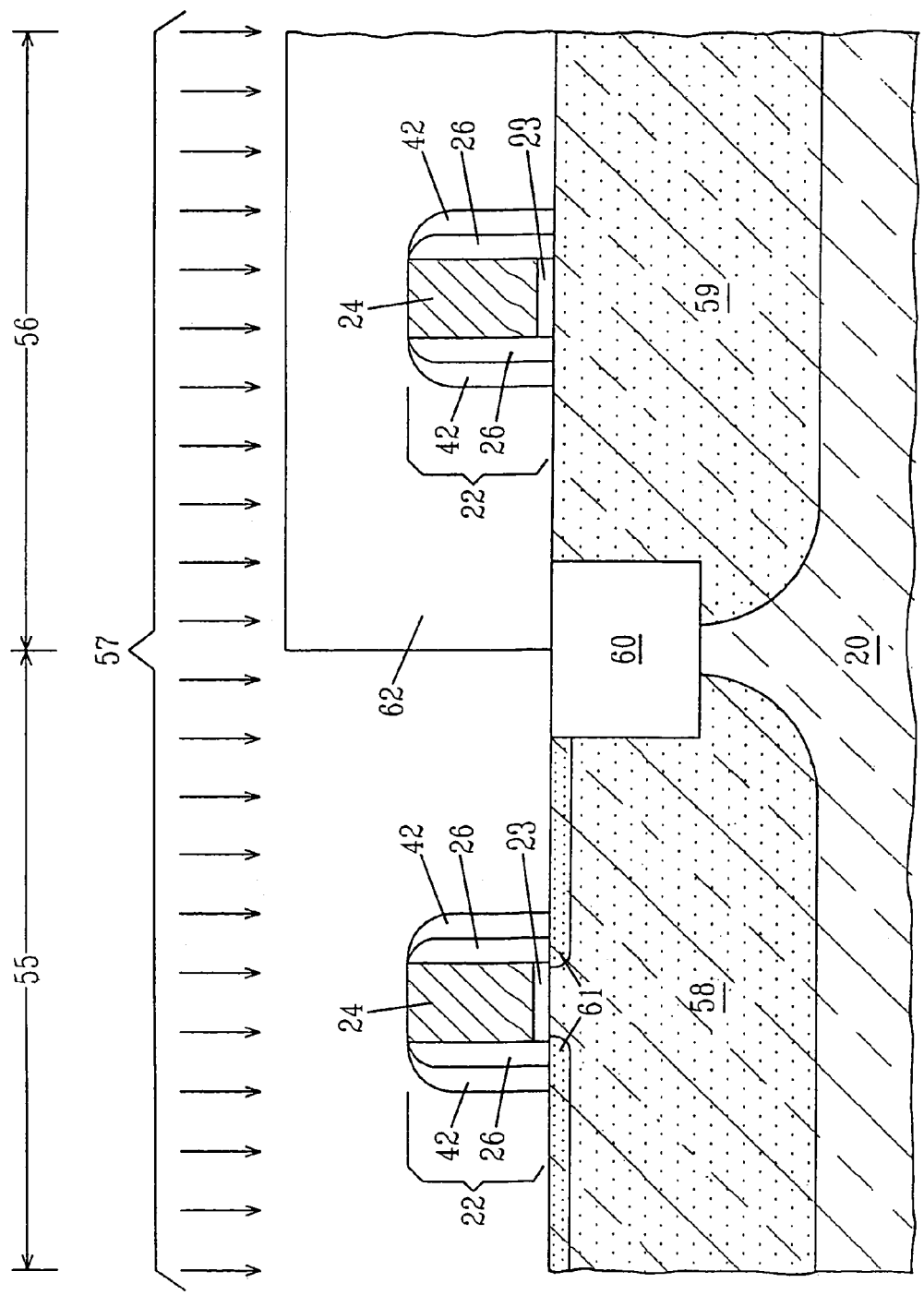
FIGS. 11-17 depict the single device region process, depicted in FIGS. 3-6 and 9-12, incorporated into a multiple device region process scheme utilizing block masks to selectively process each region, through cross sectional views.

Referring to FIG. 11, a first device region 55 and a second device region 56 separated by a STI region 60 is first provided. The first device region 55 is then implanted with p-type dopants to form a P-well 58 into the first device region 55 of the Si-containing wafer substrate 20, while blocking the second device region 56 with a block mask (not shown). The second device region 56 is then implanted with an i-type dopant to form an N-well 59, while blocking the first device region 55 with a block mask (not shown). Thereafter, a plurality of gate regions 22 are formed. A first set of spacers 26 are then formed abutting the gate region 22 in both the first device region 55 and the second device region 56.

Still referring to FIG. 11, the first device region 55 is then implanted 57 with an n-type dopant to form first device region source/drain extensions 61, while a second device region block mask 62 protects the underlying second device region 56 from being implanted. Following first device region source/drain extension 61 implant, the second device region block mask 62 is stripped.

Figure 12:
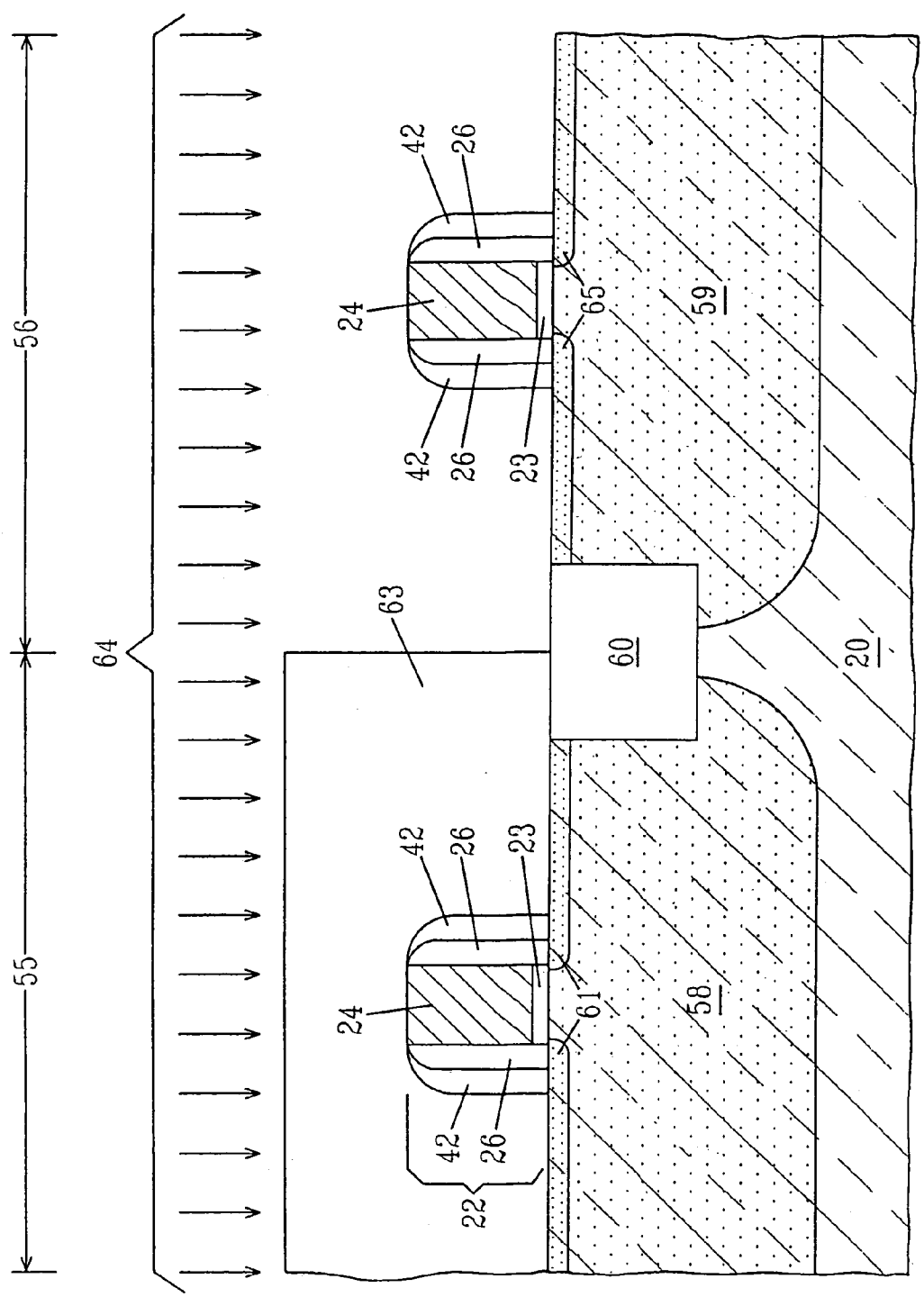

Referring to FIG. 12, following the formation of the first device region source/drain extensions 61, a first device region block mask 63 is formed over the first device region 55 and the second device region 56 is implanted 64 with a p-type dopant to form second device region source/drain extensions 65. Thereafter, the first device region block mask 63 is stripped.

Figure 13:
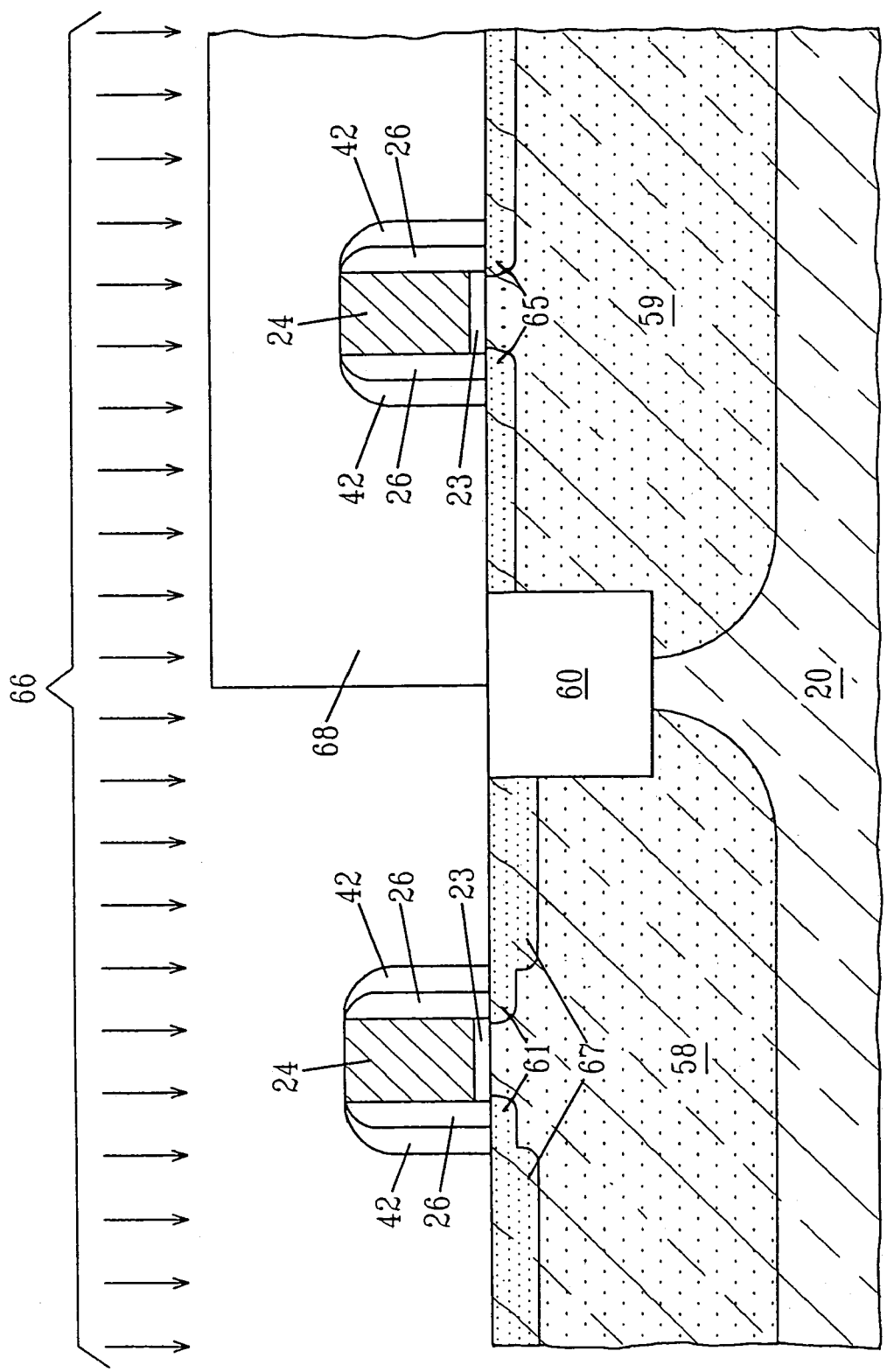
Figure 14:
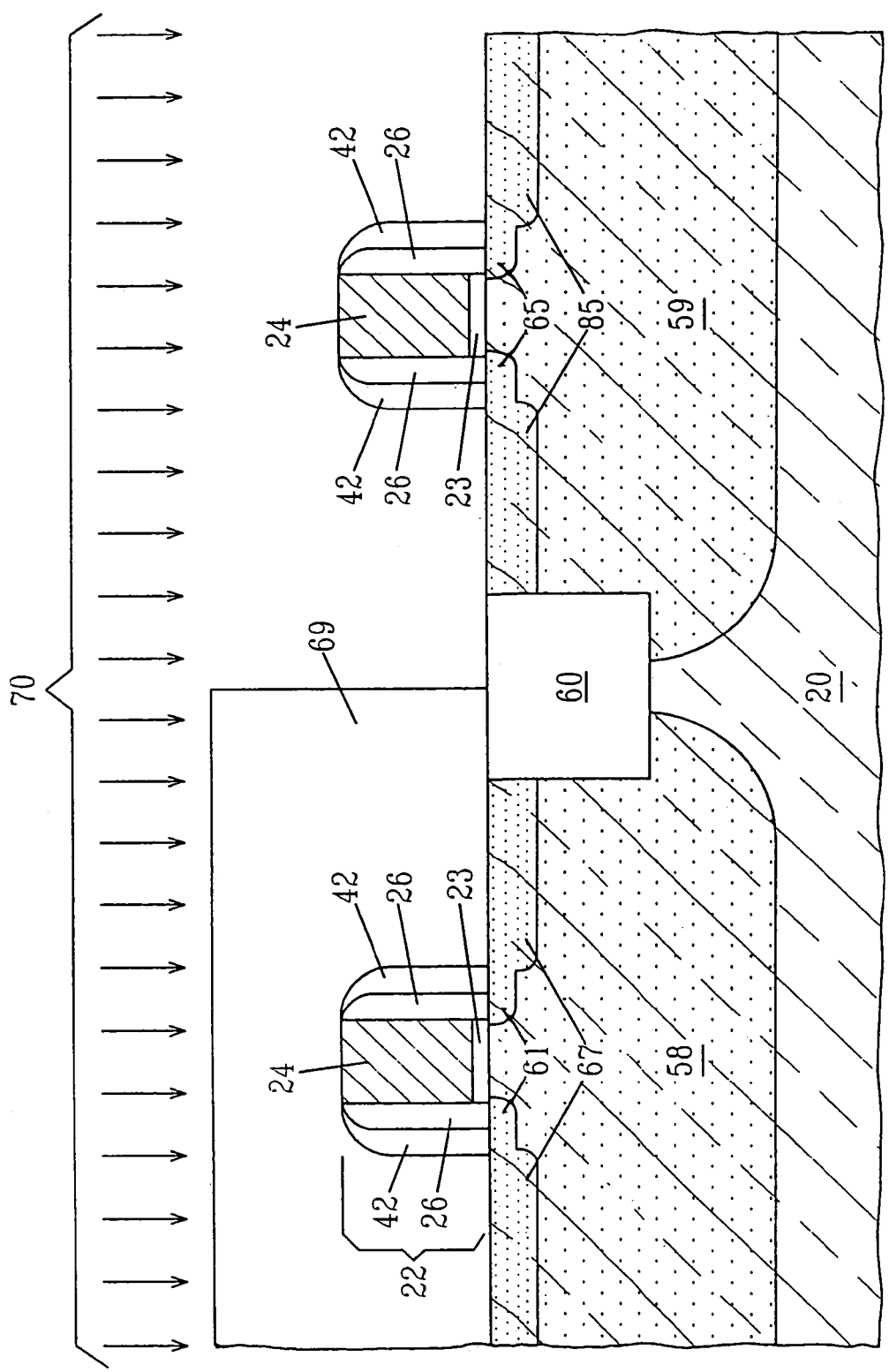

Referring to FIG. 13, a second set of spacers 42 is next formed abutting the first set of spacers 26 in both the first device region 55 and second device region 56. Following the formation of the second set of spacers 42, another second device region block mask 68 is formed and the first device region 55 is implanted 66 with an n-type dopant to form first device region source/drain diffusion regions 67. Following the removal of the second device region block mask 68, another first device region block mask 69 is formed and second device region source/drain diffusions 85 are implanted 70 using p-type dopants, as depicted in FIG. 14.

Figure 15:
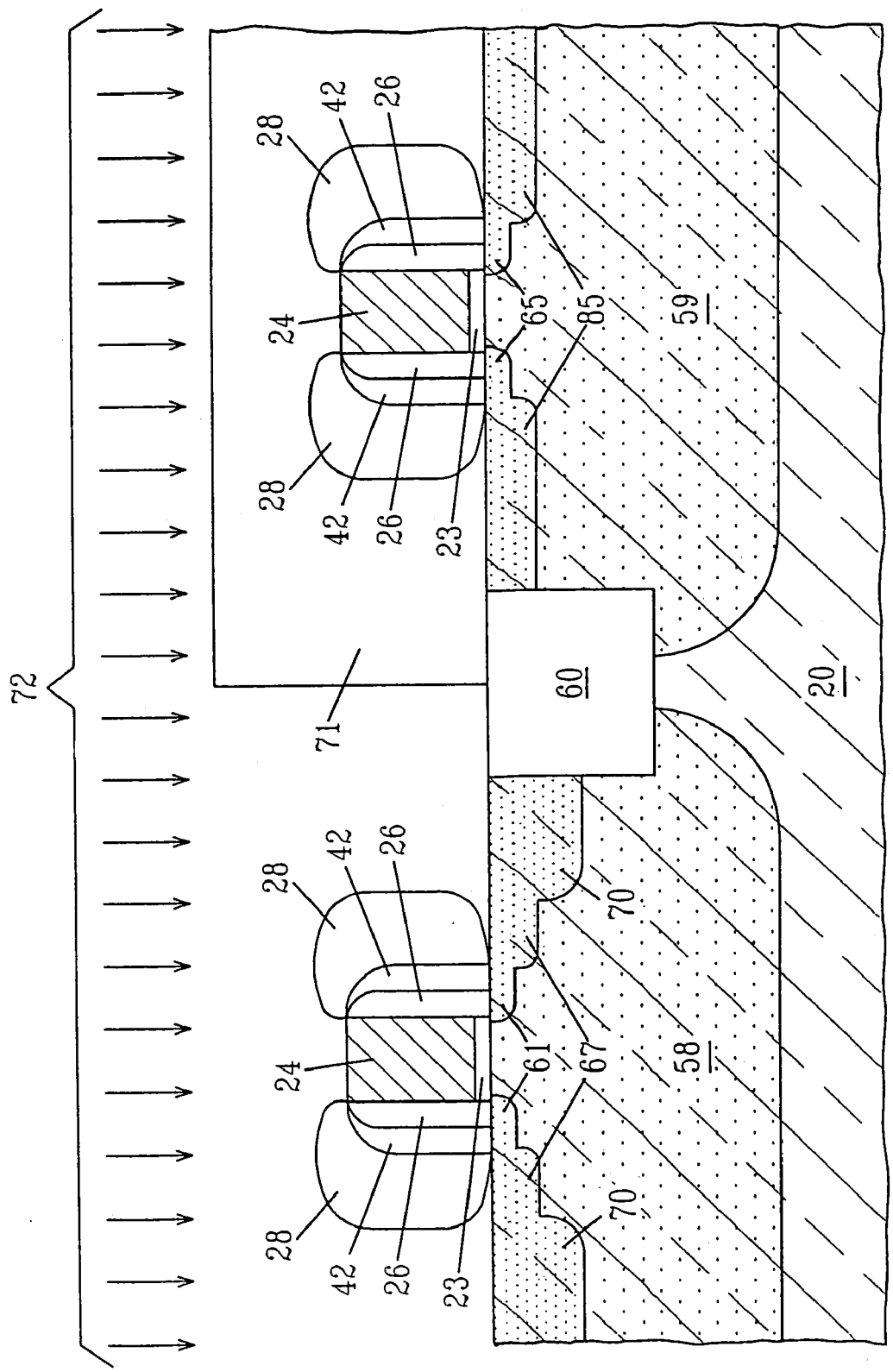
Figure 16:
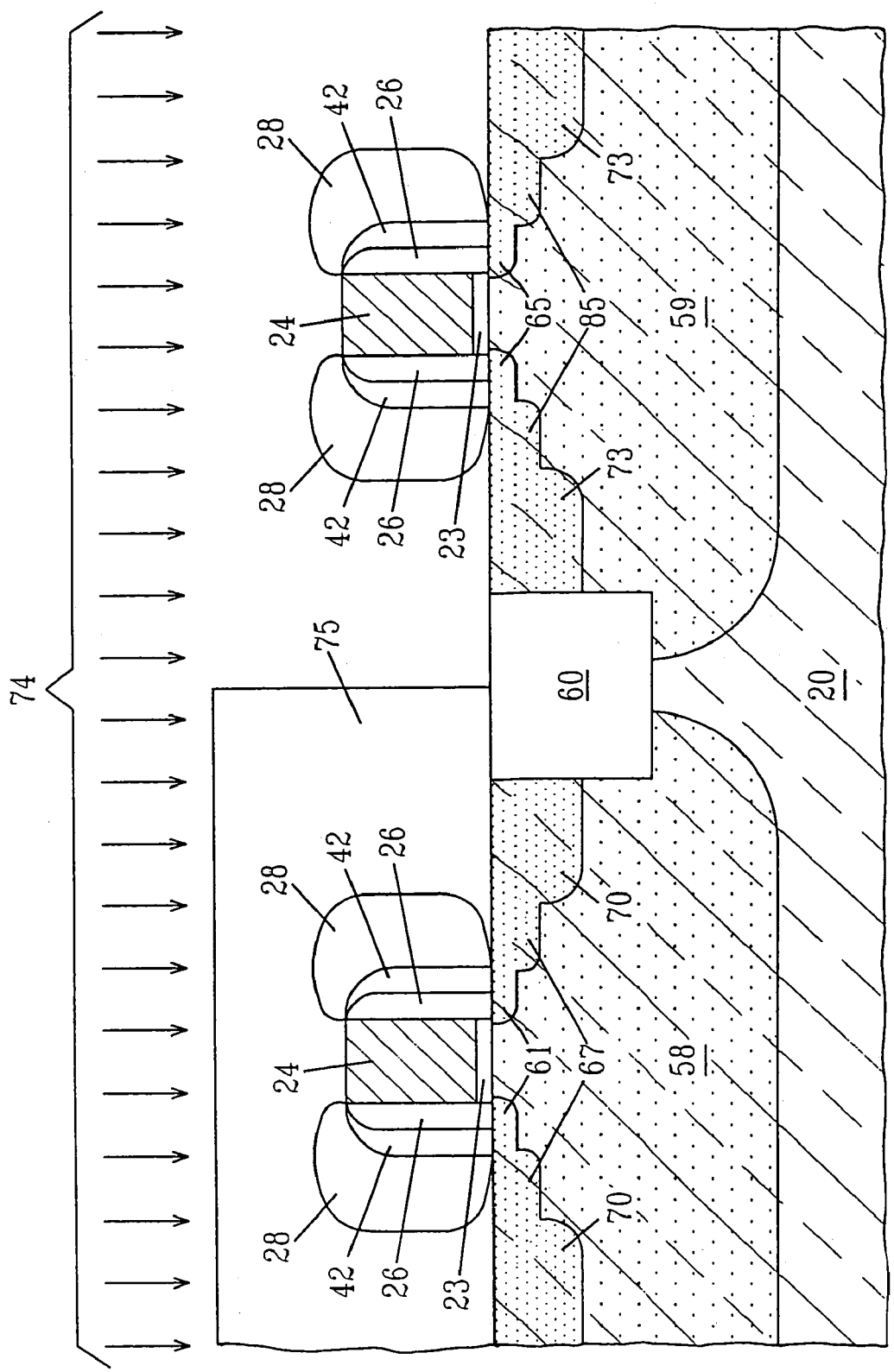

Referring to FIG. 15, once the first device region block mask 69 is stripped, source/drain oxide spacers 28 are formed on the exterior oxide surface of the second spacers 42. Thereafter, n-type deep source/drain regions 70 are implanted 72 in the first device region 55, while protecting the second device region 56 with a third second device region block mask 71. P-type deep source/drain regions 73 are then implanted 74 in the second device region 56 while the first device region is 55 protected by a third first device region block mask 75, as depicted in FIG. 16. After removing the block mask 69 and the oxide spacer 28, the structure is annealed to activate the dopants using conventional annealing processes, i.e., rapid thermal anneal. In one example, the rapid thermal annealing temperature is carried out using a temperature of 1000° C. to about 1100° C. for a time period of less than about 10.0 seconds.

Figure 17:
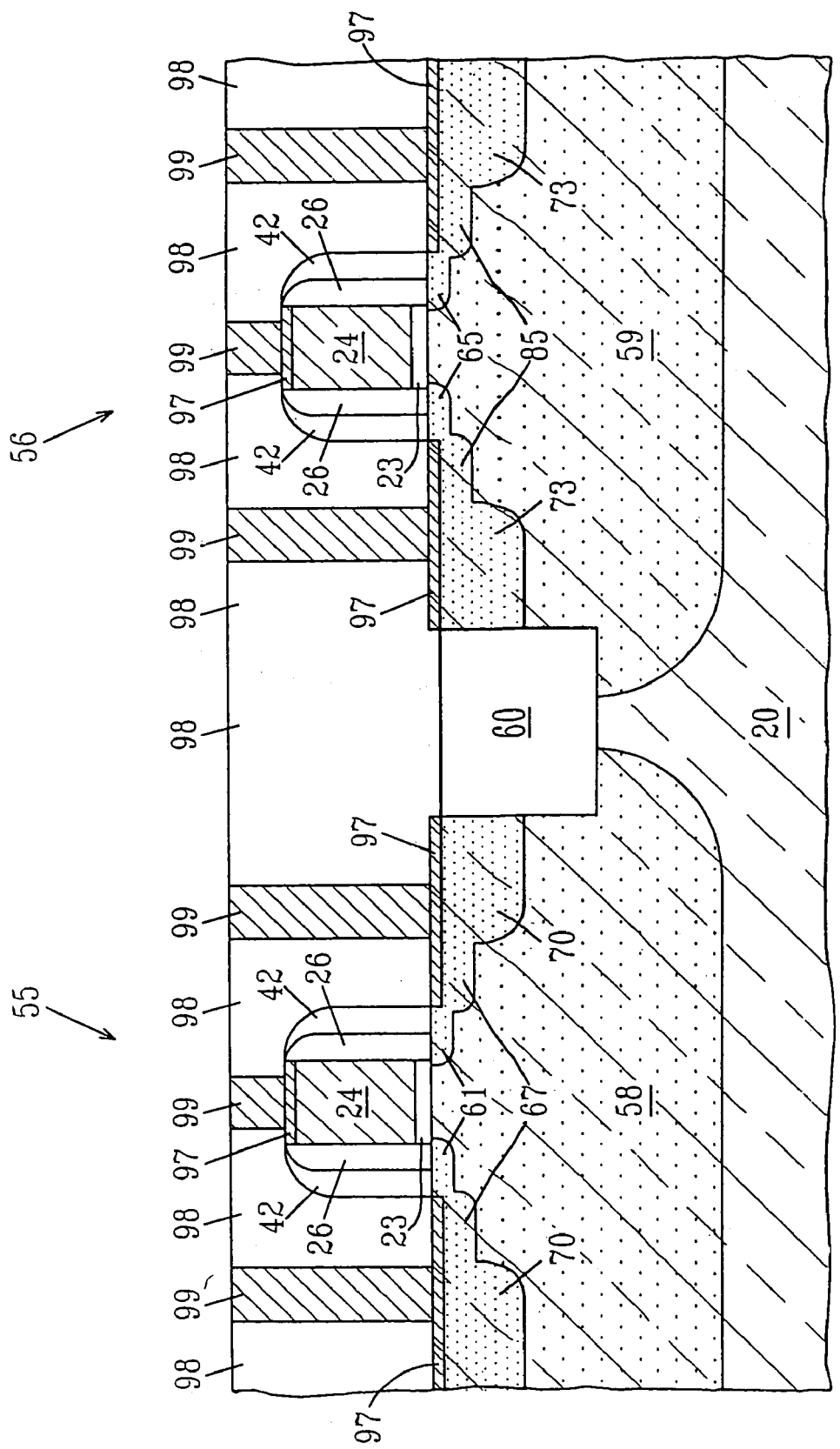

Referring to FIG. 17, following the dopant activation anneal, conventional process steps well known within the skill of the art, i.e. silicide formation 97, dielectric deposition 98, and via formation 99, are conducted to provide interconnectivity to the devices within the first and second device regions 55, 56.

The example depicted in FIGS. 11-17 produces a NMOSFET device in the first device region 55 and a PMOSFET device in the second device region. The dopants implanted into the first and second device regions 55, 56 may be alternated to form a PMOSFET in the first device region 55 and a NMOSFET in the second device region 56.

In another embodiment of the present invention, depicted in FIGS. 18-21, the formation of the source/drain oxide spacers 28 may be utilized to reduce the number of block masks required for processing multiple device regions. In this process, following the formation of source/drain extension regions 61,65, source/drain oxide spacers 28 are formed by liquid phase deposition on an exposed oxide surface of spacer 49 flanking gate region 22.

Figure 18:
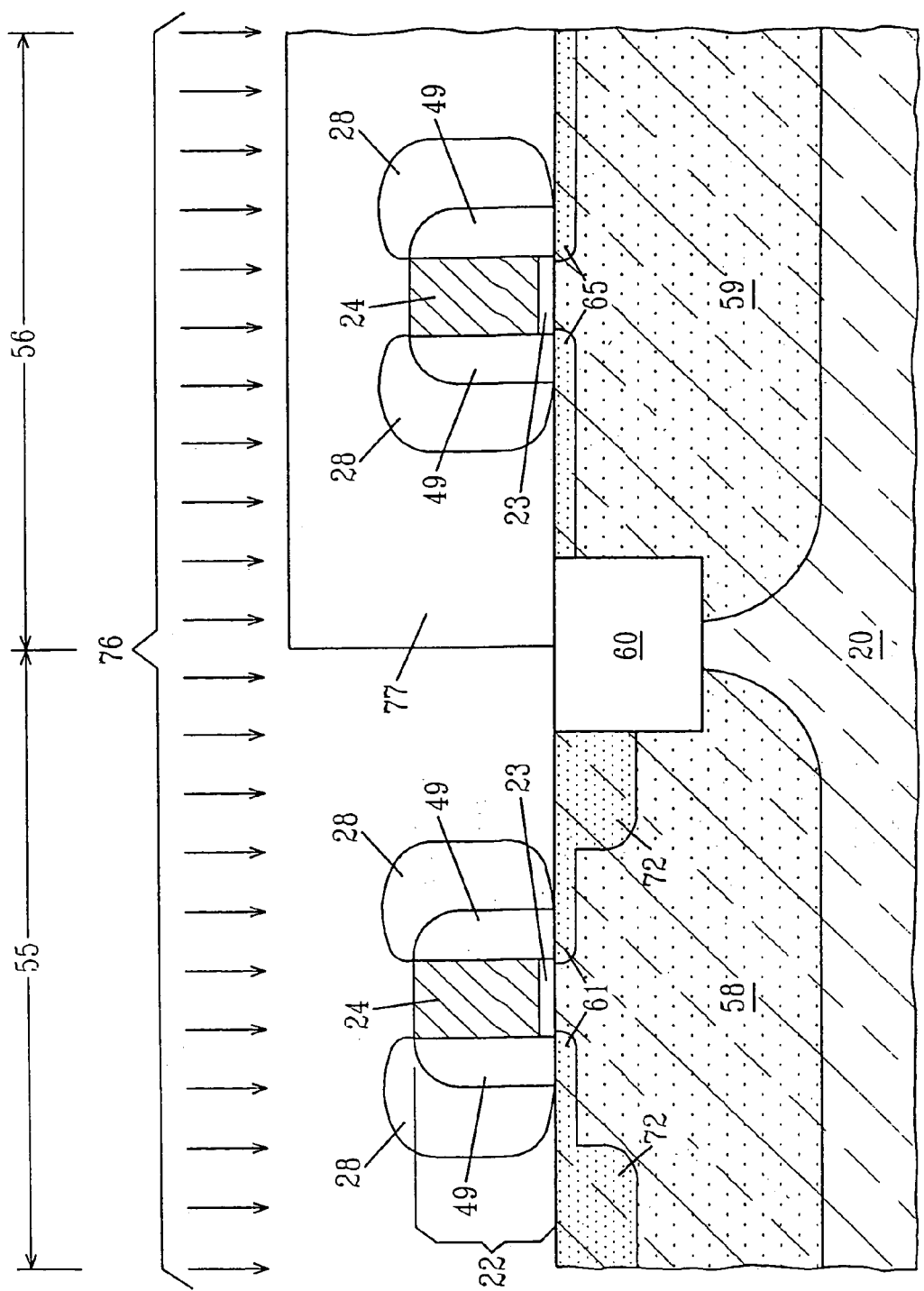
FIGS. 18-21 depicts a method for processing multiple device regions using a reduced number of block masks.

Referring to FIG. 18, n-type deep source/drain regions 72 are implanted 76 into the first device region 55, where the second device region 56 is protected from the first device region implant 76 by second device region block mask 77.

The n-type deep source/drain regions 72 are spaced from the gate region 22 by the width of the source/drain oxide spacer 28.

Figure 19:
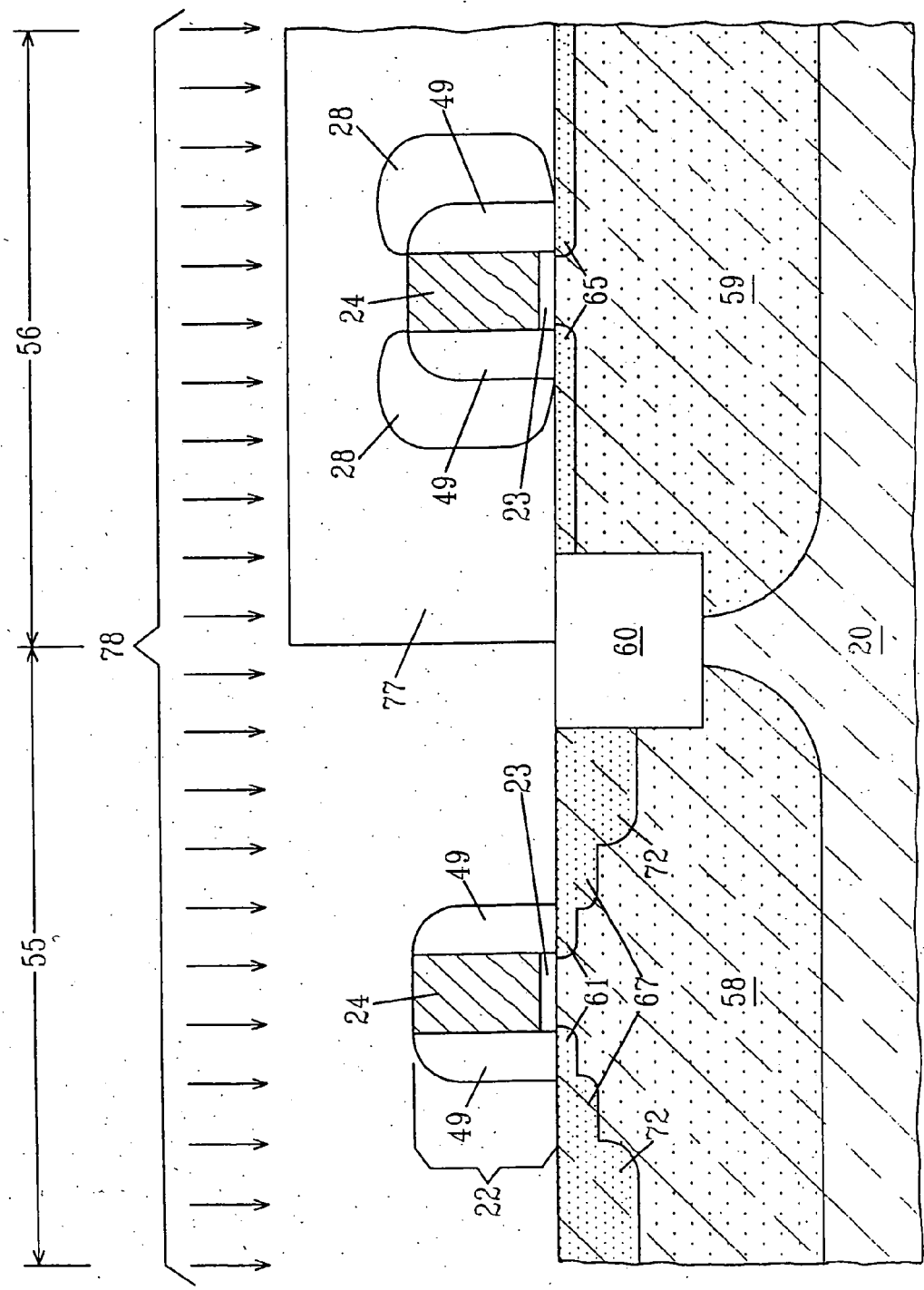

Referring to FIG. 19, following n-type deep/source drain 72 formation the source/drain oxide spacers 28 are removed using a selective etch process that removes a controlled small amount of the underlying spacer 49 and also does not remove the second device region block mask 78. A second n-type implant 78 may then be conducted to produce source/drain diffusion regions 67 in the first device region 55, where source/drain diffusion regions 67 are spaced from the gate region 22 by the width of spacer 49. Although only a single spacer 49 is depicted, multiple spacers are contemplated herein, as spacers may be incorporated or removed depending on the diffusion properties of the dopants. During the second n-type implant 78 the same second device region block mask 77 protecting the second device region 56 during the first n-type implant 76 protects the second device region 56 during the second n-type implant 78. Following the second n-type implant 78 the second device region block mask 77 is stripped using conventional methods.

Figure 20:
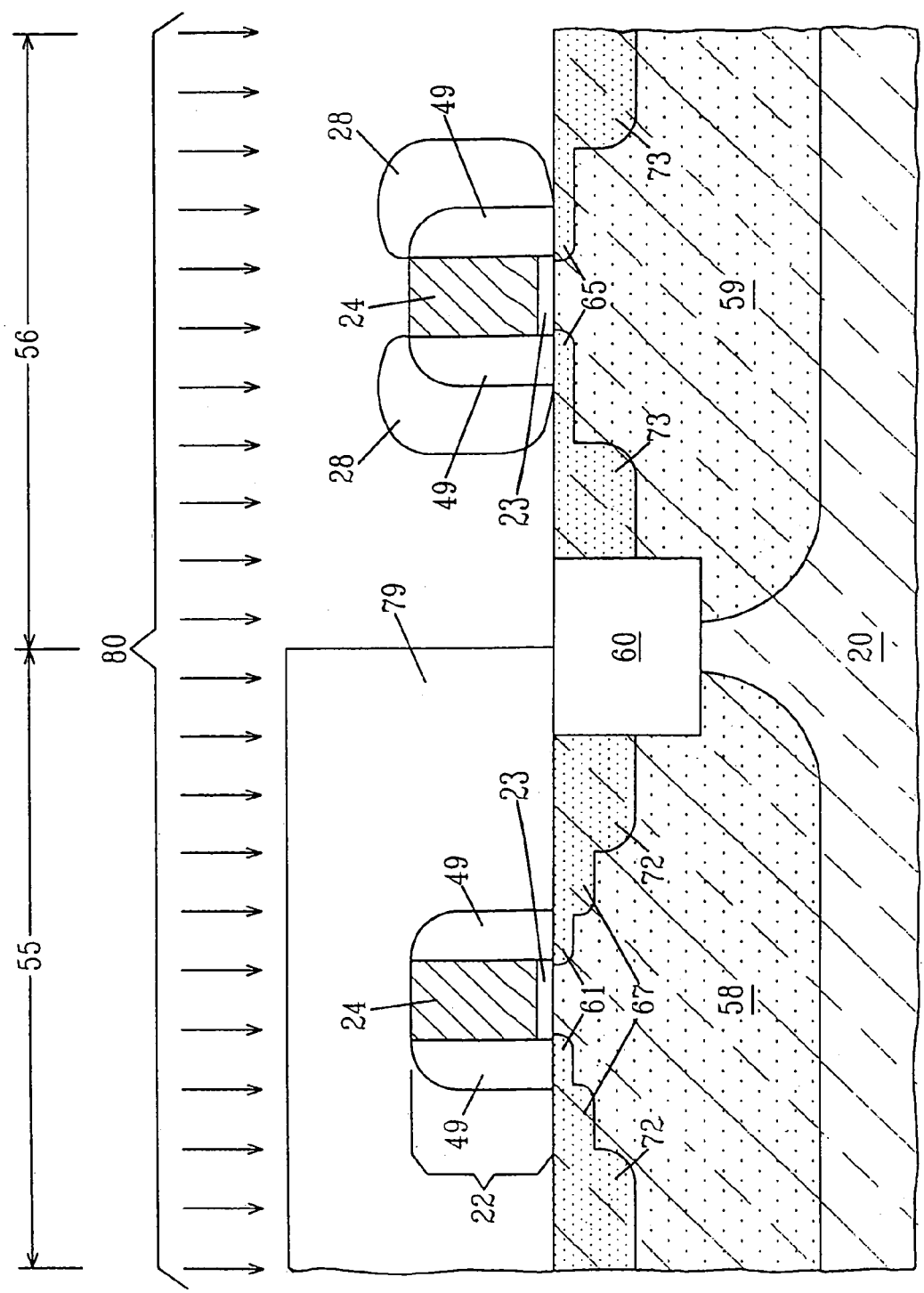

Referring to FIG. 20, a first device region block mask 79 is formed atop the first device region 55 and the p-type deep source/drain regions 73 are implanted 80 into the second device region 56. The p-type deep source/drain regions 73 are spaced from the gate region 22 by the width of the source/drain oxide spacer 28.

Figure 21:
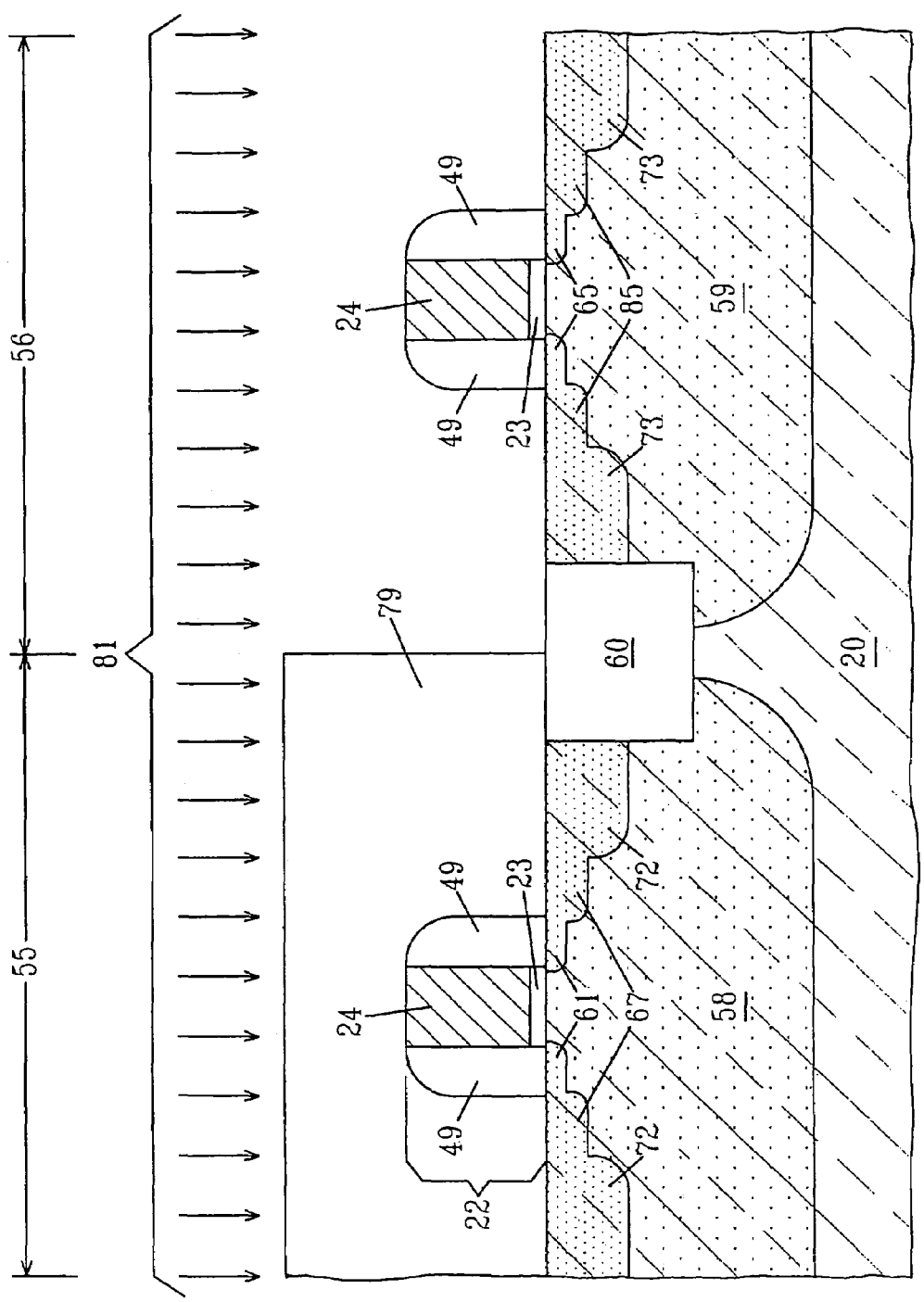

Referring to FIG. 21, following p-type deep/source drain 73 formation the source/drain oxide spacers 28 are removed using a selective etch process that removes a controlled small amount of the underlying spacer 49 and also does not remove the first device region block mask 79. A second p-type implant 78 may then be conducted to produce p-type source/drain diffusion regions 85 in the second device region 56, where p-type source/drain diffusion regions 85 are spaced from the gate region 22 by the width of spacer 49. Although only a single spacer 49 is depicted, multiple spacers are contemplated herein, as spacers may be incorporated or removed depending on the diffusion properties of the dopants. During the second p-type implant 81 the same first device region block mask 79 protecting the first device region 55 during the first p-type implant 80 protects the first device region 55 during the second p-type implant 81.

Following the second p-type implant 81 the first device region block mask 81 is stripped using conventional methods.

The example depicted in FIGS. 18-21 produces a NMOSFET device in the first device region 55 and a PMOSFET device in the second device region. Alternatively, the dopants implanted into the first and second device regions 55, 56 may be selected to form a PMOSFET device in the first device region 55 and a NMOSFET device in the second device region 56.

While the present invention has been-particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A MOSFET comprising:
a doped polysilicon gate region having a gate dopant concentration of about $5\times10^{20}$ atoms/cm$^3$ to about $5\times10^{21}$ atoms/cm$^3$; and
a substrate including source/drain diffusion regions flanking said polysilicon gate region, having a dopant concentration of about $1\times10^{19}$ atoms/cm$^3$ to about $1\times10^{21}$ atoms/cm$^3$ at a depth ranging from about 10.0 nm to about 100.0 nm, and deep source/drain regions at lateral distances greater than approximately 200.0 nm from said doped polysilicon gate region, said deep source/drain regions of said substrate having a dopant concentration of $1\times10^{19}$ atoms/cm$^3$ to about $5\times10^{21}$ atoms/cm$^3$ at a depth ranging from about 50.0 nm to about 200.0 nm.

2. The MOSFET of claim 1 wherein said substrate further comprises source/drain extension regions partially extending below said doped polysilicon gate region, where said source/drain extension regions have a dopant concentration of about $1\times10^{19}$ atoms/cm$^3$ to about $5\times10^{21}$ atoms/cm$^3$ at a depth ranging from 1.0 nm to about 30.0 nm.

3. The MOSFET of claim 1 wherein said substrate is semiconducting substrate which includes at least one isolation region therein.

4. The MOSFET of claim 1 wherein said polysilicon gate region comprises a polysilicon gate electrode and a gate dielectric, wherein said gate dielectric is located on a surface of said substrate.

5. The MOSFET of claim 4 further comprising a set of first spacers along sidewalls of said polysilicon gate region.

6. The MOSFET of claim 5 wherein said set of first spacers have a width from about 1 to about 15 nm.

7. The MOSFET of claim 5 further comprising a set of second spacers adjacent said set of first spacers.

8. The MOSFET of claim 7 wherein said set of second spacers have a width 50 to about 100 nm.

9. The MOSFET of claim 7 further comprising a source/drain oxide spacer adjacent to said set of second spacers.

10. The MOSFET of claim 9 wherein said source/drain oxide spacers comprise precipitated $SiO_2$ and fluorine atoms.

11. The MOSFET of claim 5 further comprising a source/drain oxide spacer adjacent to said set of first spacers.

12. The MOSFET of claim 11 wherein said source/drain oxide spacers comprise precipitated $SiO_2$ and fluorine atoms.

13. The MOSFET of claim 1 wherein said source/drain diffusion regions are silicided.

14. The MOSFET of claim 1 wherein a plurality of said doped polysilicon gate regions are present on a surface of said substrate.

15. The MOSFET of claim 14 wherein said plurality includes p-type polysilicon gate regions and n-type polysilicon gate regions.

16. A MOSFET comprising:
a plurality of doped polysilicon gate regions each having a gate dopant concentration of about $5\times10^{20}$ atoms/cm$^3$ to about $5\times10^{21}$ atoms/cm$^3$; and
a substrate including source/drain diffusion regions flanking said polysilicon gate regions, having a dopant concentration of about $1\times10^{19}$ atoms/cm$^3$ to about $1\times10^{21}$ atoms/cm$^3$ at a depth ranging from about 10.0 nm to about 100.0 nm, and deep source/drain regions at lateral distances greater than approximately 200.0 nm from said doped polysilicon gate region, said deep source/drain regions of said substrate having a dopant concentration of $1\times10^{19}$ atoms/cm$^3$ to about $5\times10^{21}$ atoms/cm$^3$ at a depth ranging from about 50.0 nm to about 200.0 nm.

* * * * *